United States Patent [19]
Mitani et al.

[11] Patent Number: 5,474,941
[45] Date of Patent: Dec. 12, 1995

[54] METHOD FOR PRODUCING AN ACTIVE MATRIX SUBSTRATE

[75] Inventors: Yasuhiro Mitani, Habikino; Hirohisa Tanaka, Ikoma; Hirosshi Morimoto, Kitakatsuragi; Tomohiko Yamamoto, Tenri, all of Japan

[73] Assignee: Sharp Kabushiki Kaisha, Osaka, Japan

[21] Appl. No.: 154,116

[22] Filed: Nov. 18, 1993

Related U.S. Application Data

[62] Division of Ser. No. 813,385, Dec. 26, 1991, Pat. No. 5,286,659.

[30] Foreign Application Priority Data

| Dec. 28, 1990 | [JP] | Japan | 2-408959 |
|---|---|---|---|
| Jan. 18, 1991 | [JP] | Japan | 3-4575 |
| Feb. 1, 1991 | [JP] | Japan | 3-12004 |
| Feb. 26, 1991 | [JP] | Japan | 3-30511 |
| Jun. 17, 1991 | [JP] | Japan | 3-144914 |
| Aug. 26, 1991 | [JP] | Japan | 3-213939 |
| Aug. 26, 1991 | [JP] | Japan | 3-213950 |
| Aug. 26, 1991 | [JP] | Japan | 3-213953 |
| Aug. 27, 1991 | [JP] | Japan | 3-215561 |

[51] Int. Cl.$^6$ .................................. H01L 21/336
[52] U.S. Cl. .................. 437/21; 437/44; 437/981
[58] Field of Search ................ 437/41, 44, 21, 437/981

[56] References Cited

U.S. PATENT DOCUMENTS

| 4,319,395 | 3/1982 | Lund et al. | 437/41 |
|---|---|---|---|
| 4,394,182 | 7/1983 | Maddox, III . | |
| 4,599,246 | 8/1986 | Harajiri et al. . | |
| 5,292,675 | 3/1994 | Codama | 437/44 |

FOREIGN PATENT DOCUMENTS

| 0071244 | 2/1983 | European Pat. Off. . |
|---|---|---|
| 0076587 | 4/1983 | European Pat. Off. . |
| 0338766 | 10/1989 | European Pat. Off. . |
| 0354372 | 2/1990 | European Pat. Off. . |
| 3237539 | 8/1983 | Germany . |
| 123097 | 12/1991 | Japan . |

OTHER PUBLICATIONS

Wolf, *Silicon Processing for the VLSI Era, vol. 2—Process Integration*, Lattice Press, 1990, pp. 66–67.

"Leakage Current of Amorphous Silicon Thin–Film–Transistor (TFT)" by Wu et al, Electronics Research and Service Organization, Industrial Technology Research Institute, Chutung, Hsinchu, Taiway, R.O.C., pp. 513–517.

Primary Examiner—Mary Wilczewski
Attorney, Agent, or Firm—Nixon & Vanderhye

[57] ABSTRACT

A method for producing an active matrix substrate using a thin film transistor having a gate electrode on an insulating substrate covered with a gate insulating layer, a semiconductor layer on the gate insulating layer, a channel protective layer on the semiconductor layer, a drain electrode having a portion overlying the gate electrode with the interposition of the gate insulating layer, the semiconductor layer and the channel protective layer, and a source electrode having a portion overlying the gate electrode with the interposition of the gate insulating layer, the method enhancing the transistor characteristics of the active matrix substrate with minimum leakage and the removal of an off-current generated from the presence of electrons and holes.

7 Claims, 25 Drawing Sheets

EXPOSE

1

METHOD FOR PRODUCING AN ACTIVE MATRIX SUBSTRATE

This is a divisional of application Ser. No. 07/813,385, filed Dec. 26, 1991, now U.S. Pat. No. 5,286,659.

BACKGROUND OF THE INVENTION

1. Field of the Invention

The present invention relates to a method for producing an active matrix substrate for use in liquid crystal display devices.

2. Description of the Prior Art

It is known in the art that an active matrix substrate has a relatively large single substrate on which a plurality of gate buses and source buses are arranged in a matrix and a pixel electrode formed in an area enclosed by the gate and source buses, and the pixel electrode is driven by a thin film transistor (TFT) disposed adjacent to the junctions of the gate bus and the source bus. The TFT is electrically connected to a gate electrode connected to the gate bus, and a source electrode, and a drain electrode is connected to the source bus to which the pixel electrode is electrically connected.

Referring to FIGS. 32A and 32B, a typical example of fabricating the known active matrix substrate will be described:

As shown in FIG. 32A, a gate electrode 102 is formed on a glass substrate 101 on which a gate insulating layer 103 is then formed. A semiconductor layer 104 is formed on the gate insulating layer 103. A channel protective layer 105 is patterned on the semiconductor layer 104 in an area corresponding to the gate electrode 102. Finally, $P^+$ ions are implanted to form contact layers 106a and 106b in the semiconductor layer 104.

Unnecessary parts of the contact layers 106a and 106b are removed by a photolithographic method and etching to pattern the contact layers 106a and 106b shown in FIG. 32B. FIG. 33 shows a finished state in which a source electrode 107 and a drain electrode 108 are patterned.

The substrate 101 is wholly covered with an inter-layer insulating layer 109 having a contact hole 111 through which the pixel electrode is electrically connected to the drain electrode 108. In this way an active matrix substrate is obtained.

This type of known active matrix substrate is disadvantageous in that an area around the contact layers 106a and 106b is liable to damage when $P^+$ ions are implanted into the semiconductor layer 104 to form these layers, and that this area is liable to the spread of the carrier.

Particularly in FIG. 33, if the insulating layer 103 situated in an area in which the gate electrode 102 and source electrode 107 overlap each other, or in which the gate electrode 102 and drain electrode 108 overlap each other is damaged, the desired transistor characteristics of the TFT is not achieved because of a shift in the threshold voltage which is likely to occur because electrons are trapped in the gate insulating layer 103. This results in an unstable operation.

In order to solve this problem, one proposal is that as shown in FIG. 34, a doping is carried out at a low accelerating voltage so as to prevent impurities from reaching the gate insulating layer 103 when $P^+$ ions are implanted. However, under this method, as shown in FIG. 34A, the semiconductor layer 104 has contact layers 106a and 106b which do not reach the gate insulating film layer 103. If this semiconductor layer 104 is patterned as shown in FIG. 34B, the contact layers 106a and 106b are not formed on the sides of the semiconductor layer 104. If, as shown in FIG. 35, the source electrode 107 and drain electrode 108 are patterned on the contact layers 106a and 106b, electric leakage is likely to occur between the contact layer 106a and the source electrode 107, and between the contact layer 106b and the drain electrode 108, thereby deteriorating the transistor characteristics.

In addition, this known method detrimentally allows the spreading of impurities into the channel protective layer 105 when $P^+$ ions are implanted on the patterned protective layer 105. The impurities in the channel protective layer causes an electric current to leak between the contact layer 106a and the source electrode 107, and between the contact layer 106b and the drain electrode 108, thereby deteriorating the transistor characteristics.

A further problem is that as shown in FIG. 36, the semiconductor layer 104 and source electrode 107 are located excessively near to each other with only the interposition of one end of the channel protective layer 105. Likewise, the semiconductor layer 104 and drain electrode 108 are located excessively near to each other with only the interposition of the other end of the channel protective layer 105. As a result, an electric leakage is likely to occur between the source electrode 107 and drain electrode 108, thereby causing a malfunction in the display operation. The leakage tends to occur and continue in the area indicated by the arrow in FIG. 36 because of the non-presence of contact layers 106a and 106b in this area.

In recent years, a large-capacity active matrix display device for use in a high definition (ED) TV set, a graphic display device, and the like has been developed and used. The known TFTs can not be used for such large-capacity active matrix display devices in that an electric leakage of $10^{-9}$ to $10^{-11}$ A occurs.

In order to prevent the occurrence of leakage, Japanese Patent Laid-Open Publication No. 3-4566 discloses a TFT having a structure in which contact layers having a distribution of impurities of low concentration are formed by implanting ions between the semiconductor layer and the source electrode, and between the semiconductor layer and the drain electrode. This TFT structure advantageously removes non-linear currents occurring by contact between the electrodes constituting the source area or drain area of the transistor and the semiconductor layer, and an off-current generated by the flow of electrons and holes caused by the irradiating of the semiconductor layer. This shortens the channel of the TFT, but on the other hand, the number of processes and photomasks are increased, thereby reducing production yield and reliability.

SUMMARY OF THE INVENTION

The method for producing an active matrix substrate of this invention, which overcomes the above-discussed and numerous other disadvantages and deficiencies of the prior art, wherein the active matrix substrate uses a thin film transistor having a gate electrode on an insulating substrate covered with a gate insulating layer, a semiconductor layer on the gate insulating layer, a channel protective layer on the semiconductor layer, a drain electrode having a portion overlying the gate electrode with the interposition of the gate insulating layer, the semiconductor layer and the channel protective layer, and a source electrode having a portion overlying the gate electrode with the interposition of the gate insulating layer, the semiconductor layer and the channel protective layer, the method comprising the steps of patterning the channel protective layer, implanting ions into the semiconductor layer through a resist remaining after the patterning formation of the channel protective layer, so as to form a contact layer.

In a preferred embodiment, the contact layer is formed by patterning the semiconductor layer.

In a preferred embodiment, the resist is formed on the channel protective layer by patterning and ions are implanted into the semiconductor layer through the resist, and the resist lifts off to form the drain electrode and source electrode in patterns.

As an alternative, the thin film transistor has a gate electrode on an insulating substrate covered with a gate insulating layer, a semiconductor layer on the gate insulating layer, a drain electrode having a portion overlying the gate electrode with the interposition of the gate insulating layer and the semiconductor layer, and a source electrode having a portion overlying the gate electrode with the interposition of the gate insulating layer and the semiconductor layer, the method comprising the steps of patterning a resist on the semiconductor layer, implanting ions into the semiconductor layer through the resist, so as to form a contact layer, forming an electroconductive layer used for the drain electrode and source electrode without removing the resist, and lifting off the resist to form the drain electrode and source electrode separately.

As an alternative, the thin film transistor having a gate electrode on an insulating substrate covered with a gate insulating layer, a semiconductor layer on the gate insulating layer, a channel protective layer on the semiconductor layer, a drain electrode having a portion overlying the gate electrode with the interposition of the gate insulating layer, the semiconductor layer and the channel protective layer, and a source electrode having a portion overlying the gate electrode with the interposition of the gate insulating layer, the semiconductor layer and the channel protective layer, the method comprising the steps of patterning the channel protective layer, implanting ions into the semiconductor layer by use of the patterned channel protective layer as a mask, so as to form a contact layer.

In a preferred embodiment, the contact layer is formed by implanting ions at an accelerating voltage so that impurities do not reach the gate insulating layer.

In a preferred embodiment, the ions are implanted such that the contact layer has the same thickness as that of the semiconductor layer.

As an alternative, the thin film transistor has a gate electrode on an insulating substrate covered with a gate insulating layer, a semiconductor layer on the gate insulating layer, a channel protective layer on the semiconductor layer, a drain electrode having a portion overlying the gate electrode with the interposition of the gate insulating layer, the semiconductor layer and the channel protective layer, and a source electrode having a portion overlying the gate electrode with the interposition of the gate insulating layer, the semiconductor layer and the channel protective layer, the method comprising the steps of forming the channel protective layer in a shape having reclining sides toward the source electrode and the drain electrode, and implanting ions into the semiconductor layer through the channel protective layer such that the contact layer is formed in the portions of the semiconductor layer which are directly below the foot of the reclining sides of the channel protective layer.

As an alternative, the thin film transistor has a gate electrode on an insulating substrate covered with a gate insulating layer, a semiconductor layer on the gate insulating layer, a channel protective layer on the semiconductor layer, a drain electrode having a portion overlying the gate electrode with the interposition of the gate insulating layer, the semiconductor layer and the channel protective layer, and a source electrode having a portion overlying the gate electrode with the interposition of the gate insulating layer, the semiconductor layer and the channel protective layer, the method comprising the steps of forming the channel protective layer by patterning, and implanting ions diagonally from above with respect to the substrate into the semiconductor layer having an implanted protective layer to form a contact layer in an area below the channel protective layer extending from the opposite ends of the semiconductor layer up to an area located inward of the opposite ends of the channel protective layer.

As an alternative, the thin film transistor has a gate electrode on an insulating substrate covered with a gate insulating layer, a semiconductor layer on the gate insulating layer, a channel protective layer on the semiconductor layer, a drain electrode having a portion overlying the gate electrode with the interposition of the gate insulating layer, the semiconductor layer and the channel protective layer, and a source electrode having a portion overlying the gate electrode with the interposition of the gate insulating layer, the semiconductor layer and the channel protective layer, wherein the semiconductor layer has a recess at the center in the direction of the width of the gate insulating layer, the channel protective layer has a narrower width than the semiconductor layer, and thinner crosswise portions than the central portion thereof, and ions are implanted into the semiconductor through the channel protective layer such that a contact layer is formed in an area extending from the opposite ends of the semiconductor layer up to an area inside of the sides of the channel protective layer.

As an alternative, the thin film transistor has a gate electrode on an insulating substrate covered with a gate insulating layer, a semiconductor layer on the gate insulating layer, a channel protective layer on the semiconductor layer, a drain electrode having a portion overlying the gate electrode with the interposition of the gate insulating layer, the semiconductor layer and the channel protective layer, and a source electrode having a portion overlying the gate electrode with the interposition of the gate insulating layer, the semiconductor layer and the channel protective layer, wherein the gate insulating layer has a central recess in the direction of width such that the gate insulating layer covers the gate electrode, the semiconductor layer having a stepped portion along the profile of the gate insulating layer, the channel protective layer having a narrower width than the semiconductor layer, and thinner crosswise portions than the central portion thereof, and ions are implanted into the semiconductor through the channel protective layer such that a contact layer is formed in an area extending from the opposite ends of the semiconductor layer up to an area inside of the sides of the channel protective layer.

As an alternative, the thin film transistor has a semiconductor layer having a contact region and a channel region, a gate insulating layer, a gate electrode formed on a substrate in this sequence, a source electrode and a drain electrode each kept in contact with the contact region, the source electrode and the drain electrode partly overlapping with crosswise end portions of the semiconductor layer which are wider than the gate insulating layer and the gate electrode, wherein the crosswise sides of the gate insulating layer are declined wherein the side thereof toward the gate insulating electrode has a shorter reclining surface than that of the other side thereof toward the substrate, and ions are implanted into the semiconductor layer from the gate electrode such that a contact layer is formed in a portion of the semiconductor layer overlapping with at least part of the reclining sides of the gate insulating electrode and part of the semiconductor layer out of the gate insulating layer.

As an alternative, the thin film transistor has a semiconductor layer having a contact region and a channel region, a gate insulating layer, a gate electrode formed on a substrate in this sequence, a source electrode and a drain electrode each kept in contact with the contact region, the source electrode and the drain electrode partly overlapping with crosswise end portions of the semiconductor layer which are wider than the gate insulating layer and the gate electrode, wherein the gate electrode is wider than the gate insulating layer, and ions are implanted into the semiconductor layer from the gate electrode such that a contact layer is formed in an area extending from portions of the semiconductor layer which are located below the crosswise ends of the gate electrode up to the opposite sides of the semiconductor layer.

In a preferred embodiment, the resist is patterned by exposing the back of the gate electrode to light.

In a preferred embodiment, the resist is patterned by exposing the back of the gate electrode to light, and then the channel protective layer is patterned by use of the patterned resist, and ions are implanted into the semiconductor layer through the channel protective layer to form a contact layer, and the contact layer is patterned by use of a second resist, wherein the second resist is used for patterning at least one of the source electrode and the drain electrode.

In a preferred embodiment, the resist used for fabricating the channel protective layer is patterned by exposing the back of the gate electrode to light, and then the channel protective layer is patterned by use of the patterned resist, and ions are implanted into the semiconductor layer with the resist remaining to form a contact layer.

Thus, the invention described herein makes possible the objectives of (1) providing a method for producing an active matrix substrate, the method ensuring that the injection of ions implants no impurities into the channel protective layer, thereby causing no electric leakage between the source electrode and the drain electrode, and (2) providing a method for producing an active matrix substrate, the method ensuring that ions are injected after a semiconductor layer is patterned to form a contact layer so that the sides of the semiconductor layer are doped with impurities, thereby ensuring that an electric leakage between the source electrode and the drain electrode is reduced even if the source electrode and the drain electrode are formed after the injection of ions.

BRIEF DESCRIPTION OF THE DRAWINGS

This invention may be better understood and its numerous objects and advantages will become apparent to those skilled in the art by reference to the accompanying drawings:

FIG. 2 is a sectional view showing the active matrix substrate produced in the process of FIG. 1.

FIGS. 1, 30A and 30B are showing a method for producing an active matrix substrate according to another example of the present invention.

FIGS. 4A and 4B are sectional views showing a method for producing an active matrix substrate according to another example of the present invention.

FIG. 5 is a sectional view showing the active matrix substrate produced by the process shown in FIG. 4.

FIG. 6 is a sectional view showing an active matrix substrate produced by another method of the present invention.

FIG. 7 is a sectional view showing the production of the active matrix substrate shown in FIG. 6.

FIG. 8 is an enlarged view showing a contact layer of the active matrix substrate shown in FIG. 6.

FIGS. 30A and 30B are sectional views showing a continuation from FIG. 29.

31A.

Figure 32A:
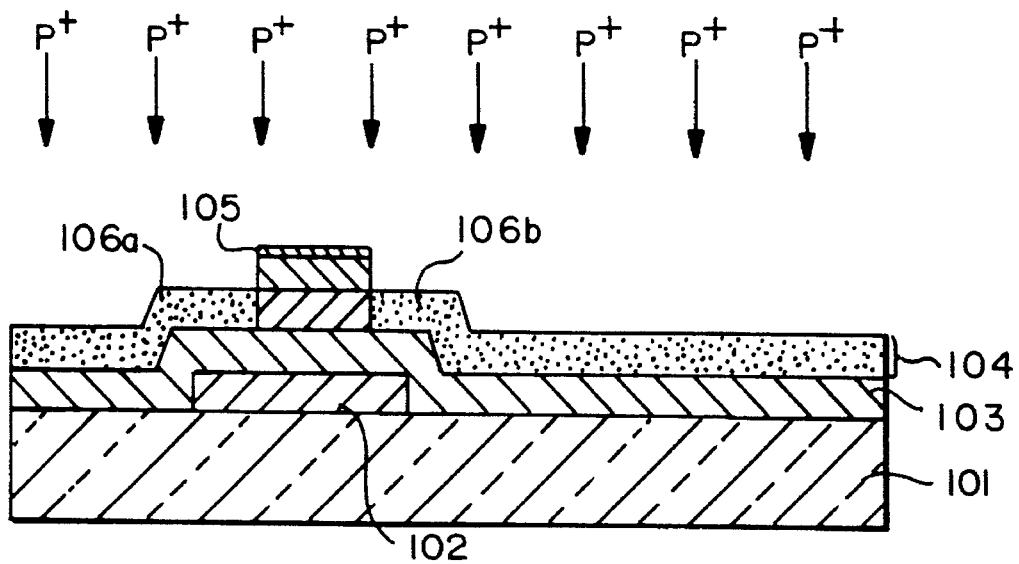
Figure 32B:
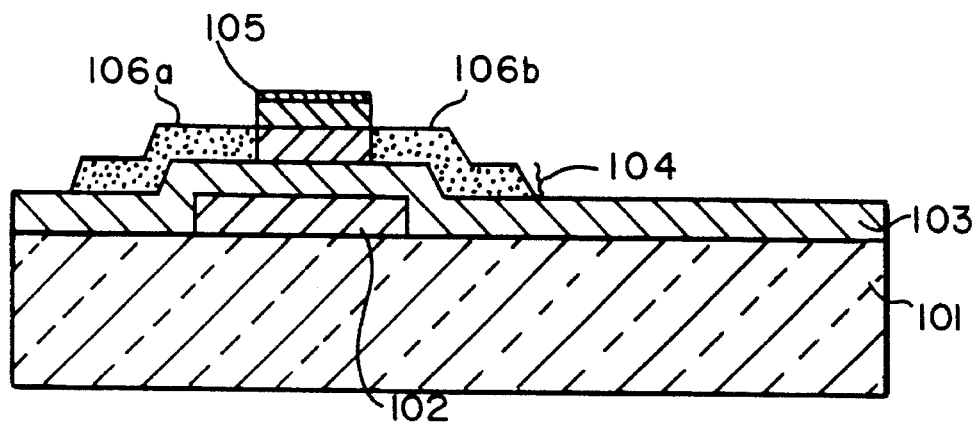

FIGS. 32A and 32B are sectional views showing a method for producing a conventional active matrix substrate.

Figure 33:
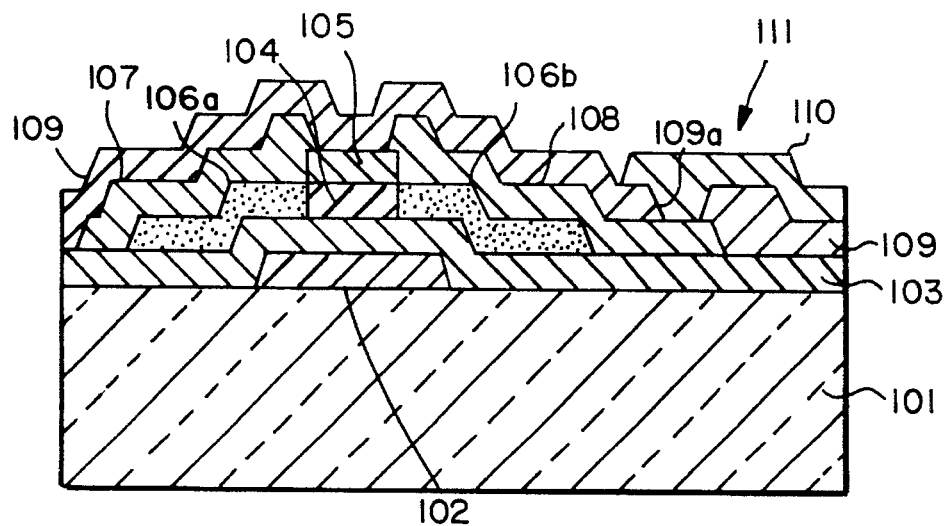

FIG. 33 is a sectional view showing the conventional active matrix substrate produced in the process shown in FIG. 32.

Figure 34A:
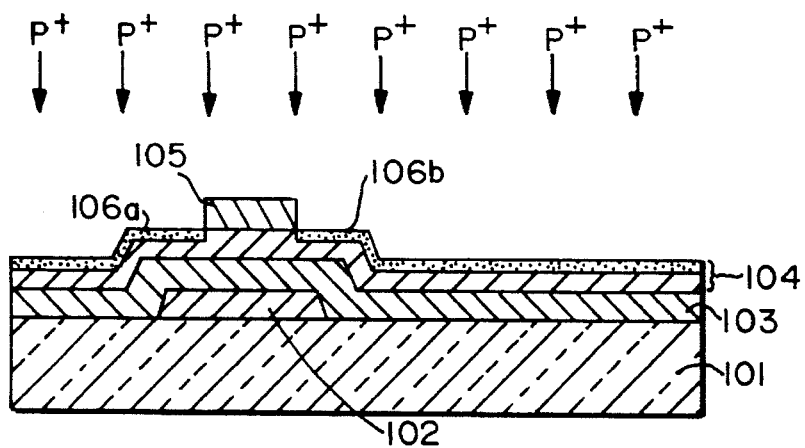
Figure 34B:
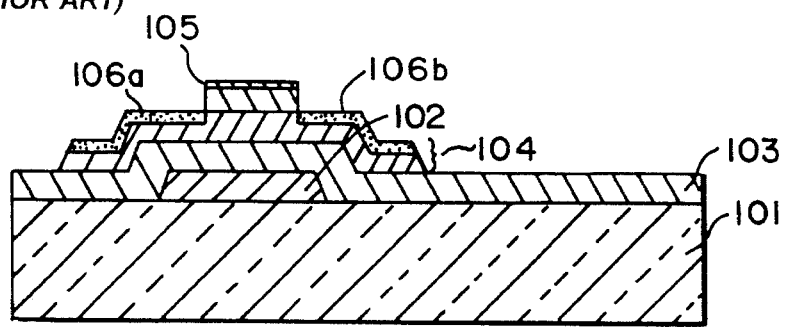

FIGS. 34A and 34B are sectional views showing a method for producing another conventional active matrix substrate.

Figure 35:
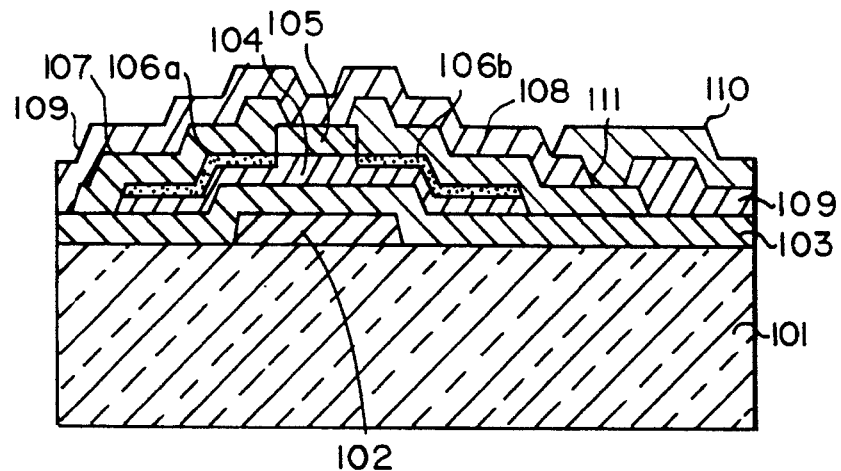

FIG. 35 is a sectional view showing another conventional active matrix substrate produced in the process shown in FIG. 34.

Figure 36:
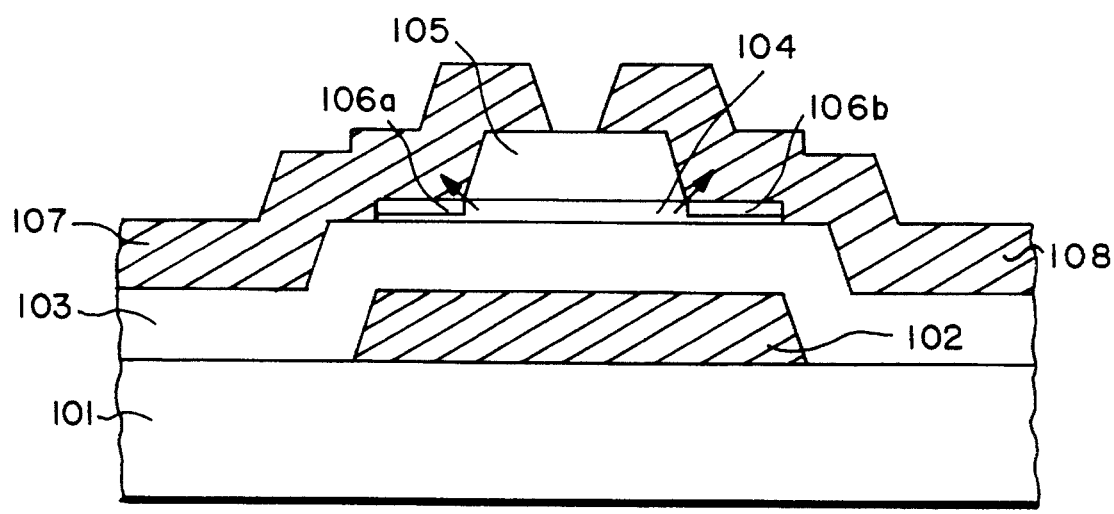

FIG. 36 is a sectional view used for describing the problems of the prior art.

DESCRIPTION OF THE PREFERRED EMBODIMENTS

The present invention will be described by way of examples:

EXAMPLE 1

This example is directed to the enhancement of the transistor characteristics of an active matrix substrate.

Figure 1A:
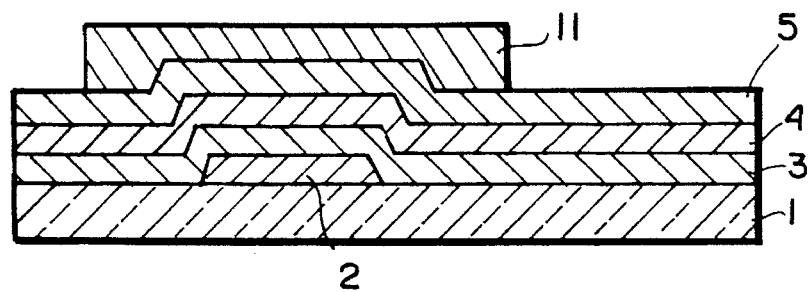
FIGS. 1A–1D, 2, 3A, 3B, 4A, 4B and 5 to 8 are a series of sectional views showing a method for producing an active matrix substrate according to an example of the present invention.
Figure 1B:
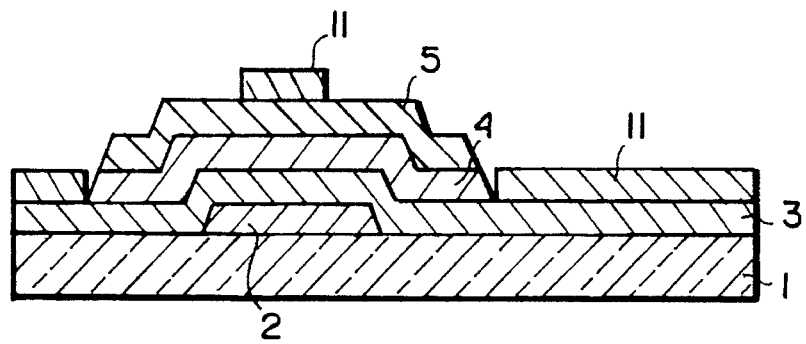

As shown in FIG. 1A, Ta is laminated on a transparent insulating substrate 1 such as a glass panel by a sputtering method to a thickness of 200 nm to 400 nm, preferably 300 nm. Then, a photomask is formed on the Ta layer and patterned to obtain a gate electrode 2. Next, a plasma CVD method is applied to stack a gate insulating layer 3 made of SiNx having a thickness of 200 nm to 400 nm, preferably 300 nm, a semiconductor layer 4 made of amorphous silicon (hereinafter referred to "a-Si") having a thickness of 20 nm to 50 nm, preferably 30 nm, and a channel protective layer 5 made of SiNx having a thickness of 100 nm to 300 nm, preferably 200 nm in this sequence on the whole surface of the glass substrate 1 so as to cover the gate electrode 2. A resist 11 is coated on the channel protective layer 5 disposed on the top surface and a photolithographic process is applied thereto using a pattern of a-Si, then the semiconductor layer 4 and the channel protective layer 5 shown in FIG. 1B are patterned. After that, the resist 11 is formed on the portion of the gate insulating layer 3 which is not covered by the semiconductor layer 4 and the channel layer 5.

Figure 1C:
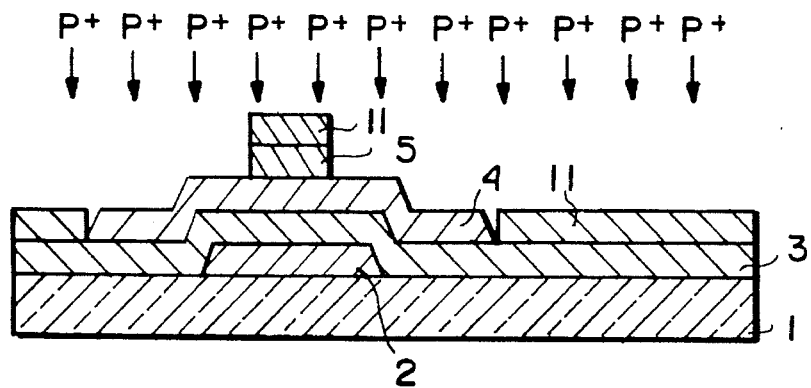

Next, photolithograph is performed and the channel protective layer 5 is patterned as shown in FIG. 1C. In this state, the resist is left on the channel protective layer 5 in the uniformed pattern.

Figure 1D:
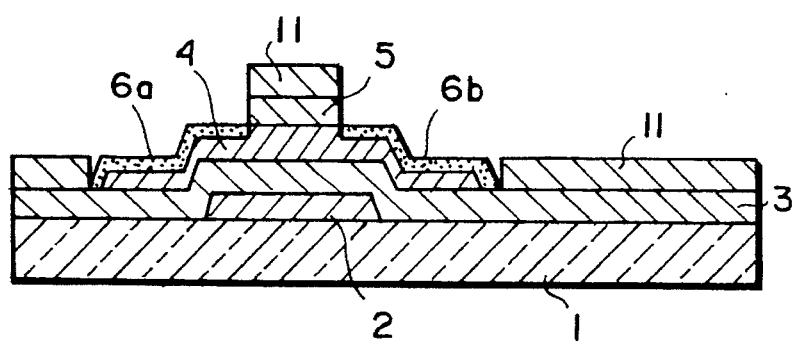

Then, as shown in FIG. 1C, $P^+$ ion is implanted into the semiconductor layer 4 from the surface of the channel protective layer 5 without peeling the resist 11, thereby forming contact layers 6a and 6b shown in FIG. 1D.

Figure 2:
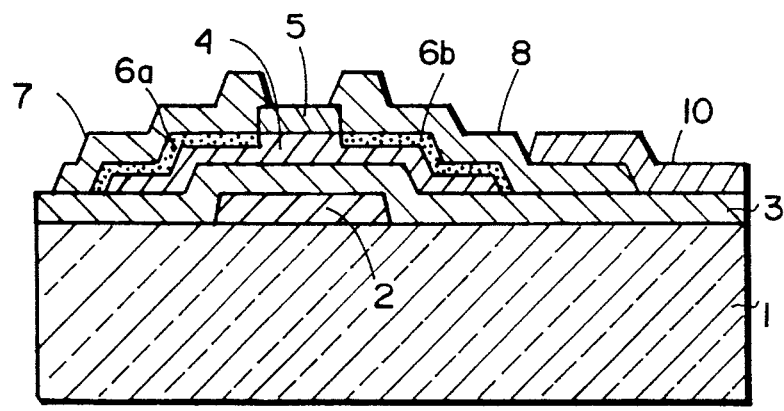

Then, a metal layer of Ti or Mo having a thickness of 200 nm to 400 nm, preferably 300 nm, is formed on the whole substrate 1 by a sputtering method, and patterned by use of photomask, thereby forming a source electrode 7 and a drain electrode 8 as shown in FIG. 2. A transparent electrode made of indium tin oxide layer (ITO) is laminated on the whole substrate 1 with a thickness of 50 nm to 100 nm, preferably 80 nm, and patterned by use of photomask to form a pixel electrode 10, thereby forming the active matrix substrate of this example.

In the active matrix produced as described above, since ion is implanted leaving the resist 11 on the channel protective layer 5, impurities are not contained on the channel protective layer 5. Therefore, leak of electric current between the contact layer 6a and the source electrode 7, and the contact layer 6b and the drain electrode 8 are significantly lessened. Further, impurities are doped on the side surface of the semiconductor layer 4, because ion is implanted to form the contact layers 6a and 6b after the patterning of the semiconductor layer 4. Therefore, the leak of electric current between side surface of the implanted contact layer 6a and the source electrode 7, and between the side surface of the implanted contact layer 6b and the drain electrode 8 can be lessened even when the source electrode 7 and the drain electrode 8 are patterned after the ion implantation. Therefore, an off electric current is decreased, whereby an active matrix with the excellent transistor characteristics can be obtained.

In addition to the example above, the present invention can be similarly applied to the thin film transistor having a structure without the channel protective layer 5.

Figure 3A:
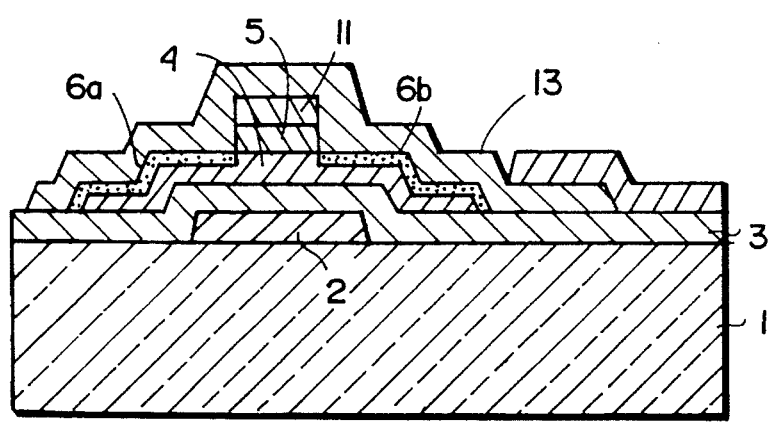
Figure 3B:
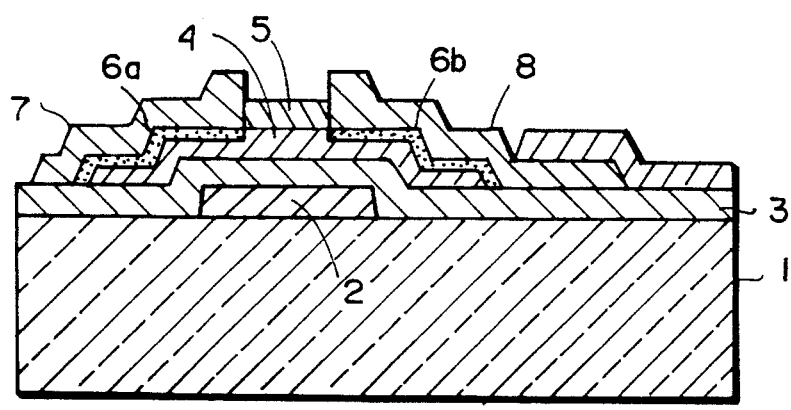

Further, the source electrode 7 and the drain electrode 8 can be also formed by the following method. The resist 11 is formed on the channel protective layer 5 over the whole substrate 1, as shown in FIG. 1D, and a metal layer 13 made of Ti or Mo with a thickness of 200 nm to 400 nm is formed thereon so as to cover the above-mentioned contact layers 6a and 6b. Then, the source electrode 7 and the drain electrode 8, as shown in the FIG. 3B, are formed by lifting off the above-mentioned resist 11 of the metal layer 13.

In this case, the patterning process can be omitted. Accordingly, the number of steps and the producing time is shortened, thereby giving a simplified and efficient producing process. This process may be applied to the case when the formation of the channel protective layer 5 is omitted.

EXAMPLE 2

This example also is directed to a method for producing an active matrix substrate having excellent transistor characteristics. More particularly, this example discloses a producing method which is effective in the case where the implantation is performed using the channel protective layer as a mask.

Figure 4A:
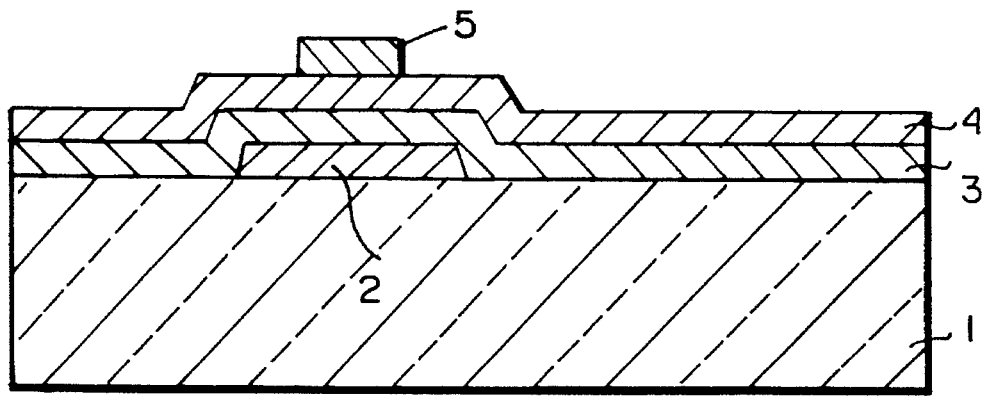
Figure 4B:
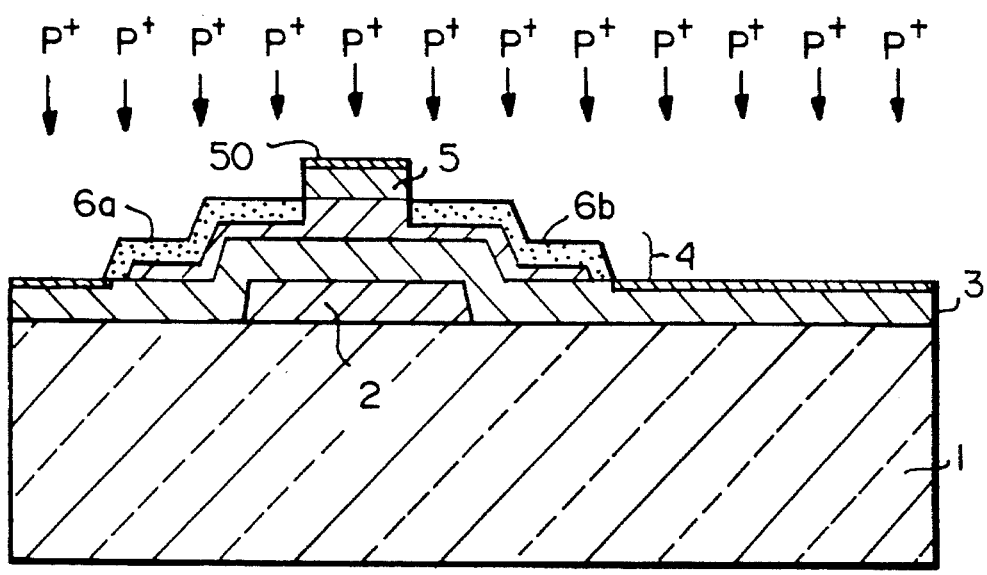
Figure 5:
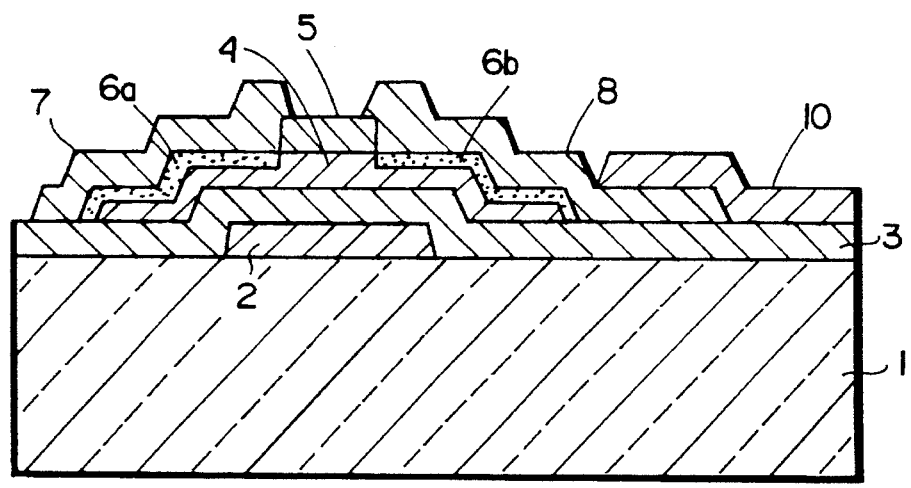

FIGS. 4A and 4B show such a method for producing an active matrix substrate. The active matrix shown in FIG. 5 is formed by the process described below.

As shown in FIG. 4A, Ta is laminated on the transparent insulating substrate 1 such as a glass substrate by a sputtering method to have a thickness of 200 nm to 400 nm, preferably 300 nm. Then, a photomask is formed thereon and patterned to obtain a gate electrode 2. Next, a gate insulating layer 3 made of SiNx with a thickness of 200 nm to 400 nm, preferably 300 nm, by plasma CVD method, a semiconductor layer 4 made of a-Si with a thickness of 30 nm to 200 nm, and a channel protective layer 5 made of SiNx with a thickness of 100 nm to 300 nm, preferably 200 nm, are laminated in this sequence on the whole surface of the glass substrate 1 so as to cover the gate electrode 2. Then, the channel protective layer 5 is patterned to have a formation as shown in FIG. 4A.

Then, the semiconductor layer 4 is patterned as shown in FIG. 4B and the contact layers 6a and 6b are formed by implantation of $P^+$ ion to the semiconductor layer 4 from the side of the channel protective layer 5. At this time, accelerating voltage of ion is arranged not to reach the gate insulating layer 3. The value of the accelerating voltage is varied in accordance with a thickness of the semiconductor layer 4. For example, when the thickness of the semiconductor layer 4 is 30 nm, which is the minimum value of this example, the value is set to be around 30 kV. When ion is implanted under the condition impurities are doped on side surface of the semiconductor layer 4 as shown in FIG. 4B, so that large leakage of the electric current does not occur between the side surface of the semiconductor layer 4 and the source electrode 7 as shown in FIG. 5, and between the side of the semiconductor layer 4 and the drain electrode 8.

Next, the channel protective layer 5 is treated by a surface cleaning treatment with, for example, buffered HF (etching buffer solution which is a mixture of hydrogen fluoride and ammonium fluoride) to eliminate the damaged portion 50. By the elimination of the damaged portion 50, the leak of the electric current between the source electrode 7 and the drain electrode 8, both of which are formed later, can be lessened. Note that it is not necessary to eliminate the whole portion of the channel protective layer 5 but only the damage portion 50 must be eliminated.

After the surface treatment is completed, a metal layer made of Ti or Mo is formed with a thickness of 200 nm to 400 nm, preferably 300 nm, by he sputtering method on the whole surface of the substrate 1. The metal layer is patterned by the use of a photomask to form the source electrode 7 and the drain electrode 8 shown in FIG. 5, thereby obtaining a thin transistor.

The transparent electrode made of Indium tin oxidized layer (ITO) is laminated to a thickness of 50 nm to 100 nm, preferably 80 nm, on the whole surface of the substrate 1 and patterned by the use of a photomask to form a pixel electrode 10, thereby forming the active matrix of the present invention.

In this example, leak of the electric current is significantly lessened, because ion is implanted after the pattern formation of the semiconductor layer 4, impurities are implanted on the side surface of the semiconductor layer 4, and simultaneously, the damaged portion is eliminated by cleaning with the channel protective layer 5 used as a mask. Therefore, an active matrix having excellent transistor characteristics can be obtained. In addition, since the gate insulating layer 3 is arranged not to be reached by impurities when implanting ion, the gate insulating layer 3 may not be damaged. Therefore, threshold voltage shift does not occur, thereby attaining excellent transistor characteristics and improving the reliability as an active matrix substrate.

EXAMPLE 3

This example is directed to a method for producing an active matrix which can eliminate OFF electric current using electrons and a hole as a carrier to attain excellent transistor characteristics.

Figure 6:
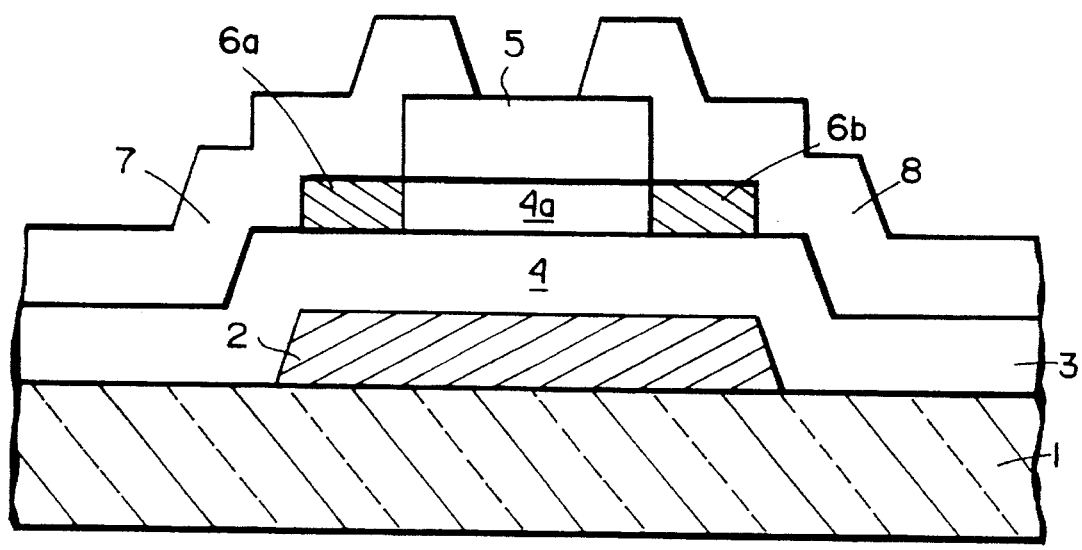

FIG. 6 shows such an active matrix. The active matrix substrate is produced by the process as described below. First, a gate electrode 2 is formed on the insulating substrate 1 made of a transparent glass. In concrete, a single layer or plural layers made of Ta, Ti, Al, Cr or the like is laminated on the insulating substrate 1 by a sputtering method to have a thickness of 200 nm to 400 nm, then patterned. At this time, the gate electrode 2 is branched to form a gate bus line.

Next, gate insulating layer 3 and semiconductor layer 4 made of a-Si are laminated in this sequence on the insulating substrate 1 disposed the gate electrode 2. The gate insulating layer 3 is formed by plasma CVD method by laminating SiNX to have a thickness of 200 nm to 500 nm. The semiconductor layer 4 thereon contains contact layers 6a and 6b on both sides of the semiconductor layer 4a made of a-Si, which is in the center of the width direction. The contact layers 6a and 6b are formed by implanting ion to the semiconductor layer 4. The thickness of the contact layer is varied in accordance with the ion implantation.

Figure 7:
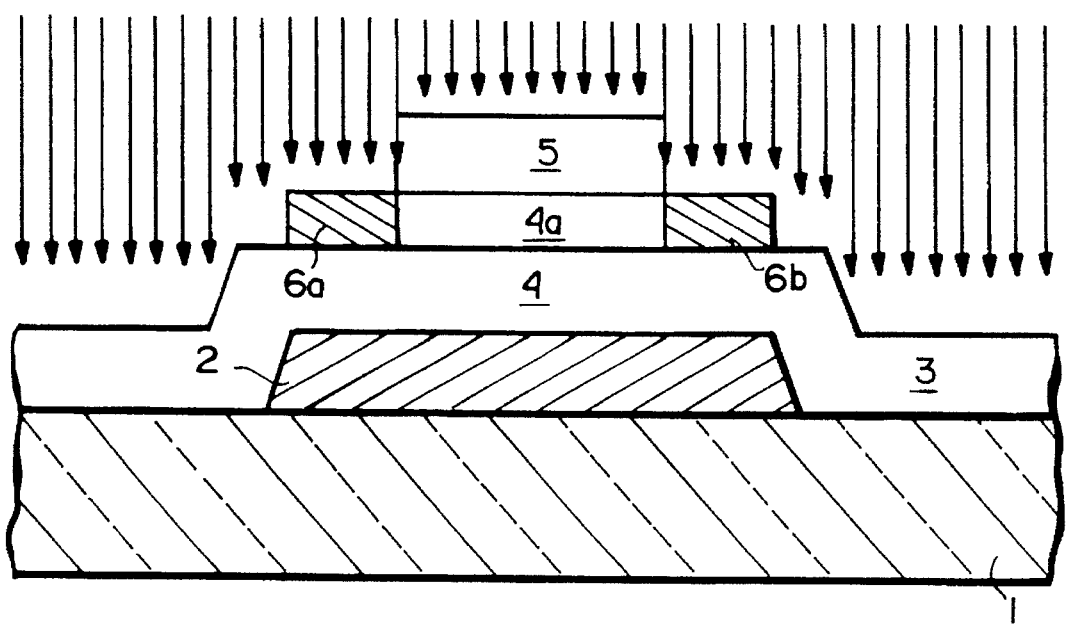

When the semiconductor layer 4 is made of a-Si, the a-Si is laminated on the gate insulating layer 3, as shown in FIG. 7, to have a thickness of 20 nm to 150 nm, preferably 25 nm to 100 nm and more preferably 25 nm to 50 nm, then patterned to form the semiconductor layer 4. Next, a channel protective layer made of SiNx, SiO$_2$ or the like is similarly formed with a thickness of 100 nm to 300 nm. Then, through the channel protective layer 5, for example, impurities from Group V elements or the compound thereof, or Group III elements or the compound thereof are ion implanted to the semiconductor layer 4 at the accelerating voltage 1 kV to 100 kV. When the semiconductor layer 4 has a thickness of 50 nm, preferable accelerating voltage for ion implantation is 10 kV to 50 kV.

By ion implantation, both sides of the semiconductor layer 4, which are not covered with the channel protective layer 5, become contact layers 6a and 6b, into which impurities are implanted at a high density. While the portion located directly below the channel protective layer 5 is separated from the channel protective layer 5, thereby attaining the original state to form semiconductor layer 4a.

Further, the contact layers 6a and 6b are formed throughout the semiconductor layer 4 on both sides. The thickness of the contact layers 6a and 6b is equal to that of the semiconductor layers 4a and 4.

A source electrode 7 and a drain electrode 8 having one end on the channel protective layer 5 are formed on the insulating substrate 1 and disposed on the contact layers 6a and 6b as described above. The source electrode 7 and the drain electrode 8 are formed by lamination of a metal layer made of Ti, Al, Mo, Cr or the like to have a thickness of 200 nm to 400 nm, and patterned, thereby producing a thin transistor.

The active matrix is produced by forming a pixel electrode by electrically connected to the drain electrode 8 of the thin film transistor. The pixel electrode is formed indium tin oxide layer (ITO) with a thickness of 50 nm to 100 nm.

Figure 8:
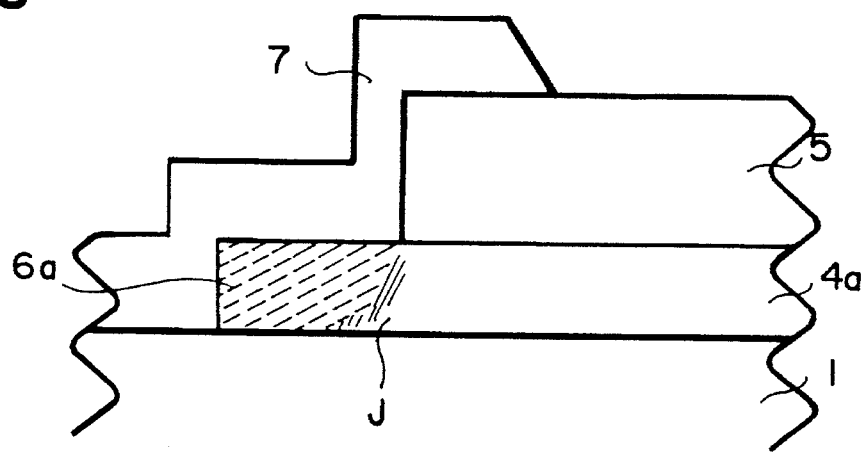

FIG. 8 is a enlarged view of the vicinity of junction between the contact layer 6a of the active matrix and the semiconductor layer 4a formed as described above. As is apparent from the figure, thickness of the cross section of the area occupied by the vicinity of junction J is at most equal to the thickness of the semiconductor layer 4. In contrast, the area occupied by the vicinity of 3unction J becomes large, if the contact layer 106a is formed by laminating semiconductor thin layer containing impurities such as Group V elements, as shown in FIG. 9, or if the thickness of the contact layer which is formed by ion implantation is thinner than the semiconductor layer 104, as shown in FIG. 10.

Figure 9:
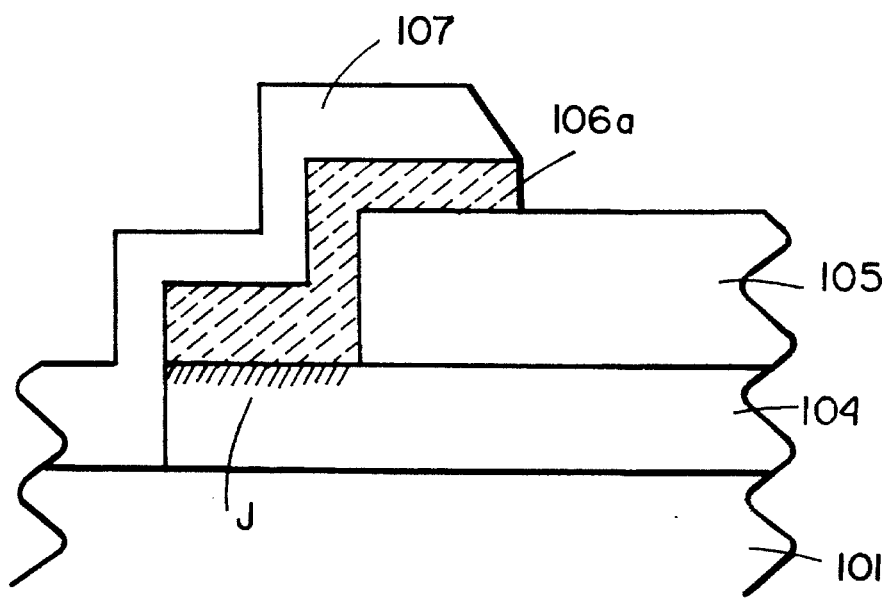
FIG. 9 is a sectional view showing a contact layer produced by a known method.
Figure 10:
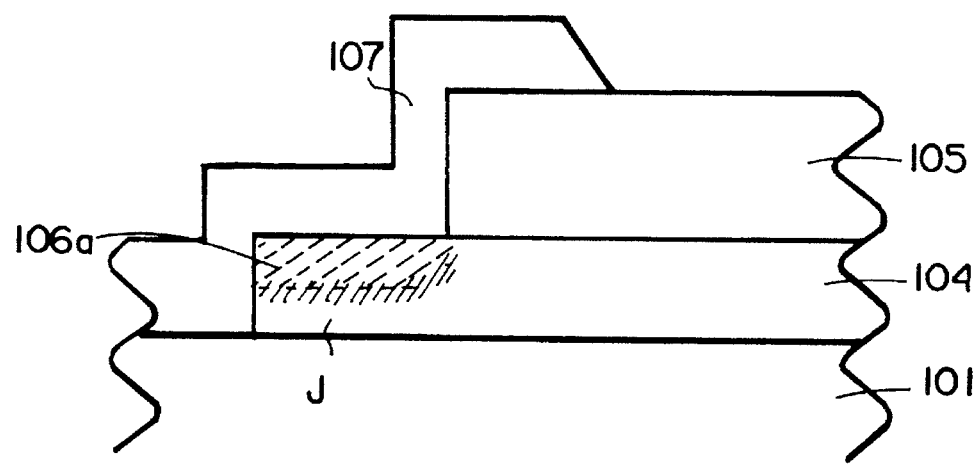
FIG. 10 is a sectional view showing a contact layer of an active matrix substrate produced by a known method.

Accordingly, in this example,as shown in FIG. 8, it is apparent from the comparison with FIGS. 9 and 10 that the area occupied by the vicinity of Junction J is greatly reduced. Therefore, OFF electric current of which carrier is a plurality of electrons generated in the semiconductor layer by light radiation or holes corresponding to the electrons can be made 1 to 2 digits smaller compared to the case shown in FIGS. 9 and 10. As a result, an active matrix substrate showing stable characteristics even in the light radiation can be achieved. In conventional cases, layer thickness had to be controlled to about 30 nm, because electric current is increased by the increase of light absorption according to how the distance through which light passes is enlarged. However, in this example, because of the stable characteristics to the light, the layer thickness of the semiconductor layer can be made more than or equal to 50 nm, thereby decreasing light absorption to deteriorate OFF electric current and improving the transistor characteristics.

Although Taper is not formed in the channel protective layer in this example, it is apparent that tapered channel protective layer can be used for the present invention.

EXAMPLE 4

This example shows the case in which the portion of a semiconductor layer disposed directly under a channel protective layer has contact layers in order to prevent leak occurrence by separating the drain electrode and a contact layer, and the source electrode and a contact layer.

Figure 11:
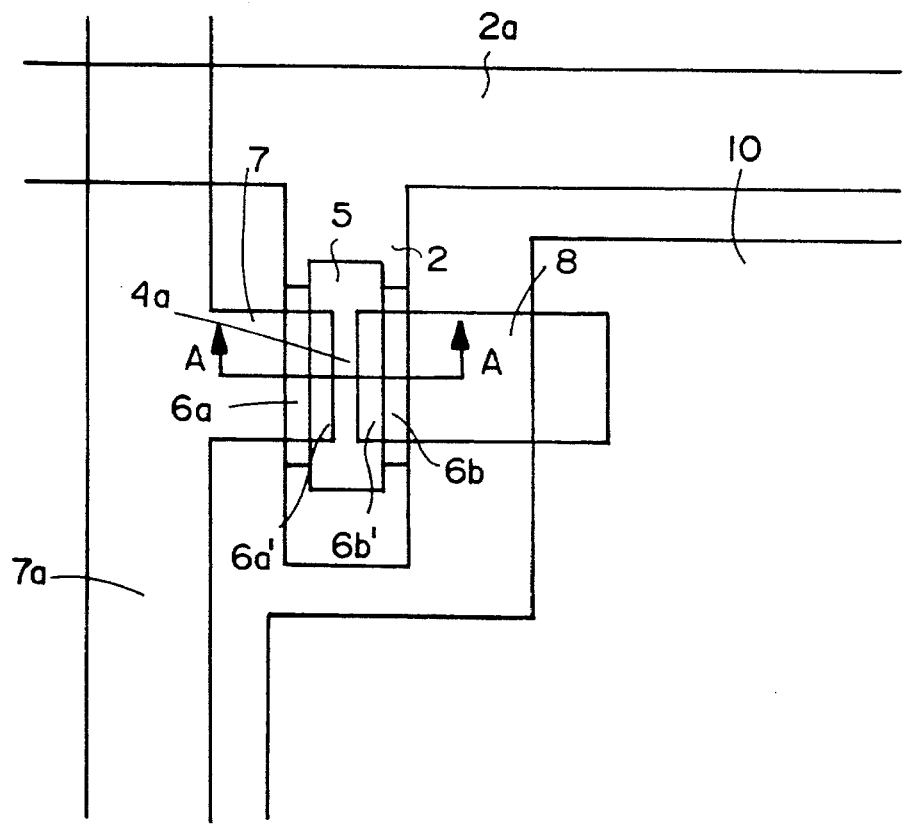
FIG. 11 is a plan view showing the active matrix substrate produced by another method of the present invention.
Figure 12:
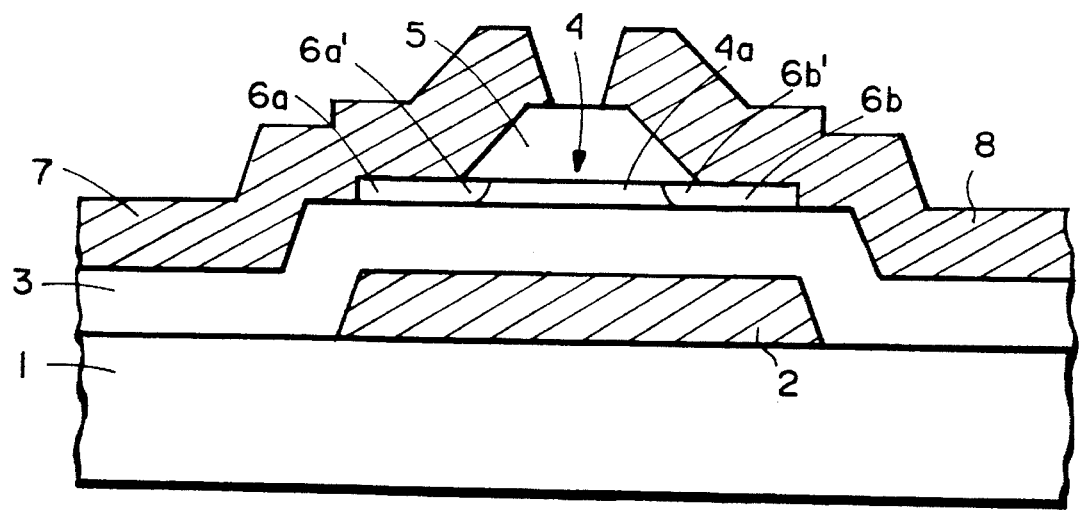
FIG. 12 is a sectional view taken along line A—A shown FIG. 11.

FIG. 11 is a plan view showing such an active matrix substrate and FIG. 12 is a sectional view taken along line A—A. The active matrix substrate of this example has a gate electrode on a transparent insulating substrate 1 such as a glass substrate. Metals of a single layer or plural layers made of Ta, Ti, Al, Cr or the like is laminated on the transparent insulating substrate 1 with a thickness of 200 nm to 400 nm by a sputtering method, then patterned to obtain the gate electrode 2. A gate bus line 2a containing the gate electrode 2 branched from the gate bus line is also formed in this step (See FIG. 11).

A gate insulating layer 3 and a semiconductor layer 4 made of a-Si are formed on the substrate 1 having the gate electrode thereon. The gate insulating layer 3 is, for example, laminated with SiNx to have a thickness of 200 nm to 500 nm by plasma CVD method. Contact layers 6a and 6b, into which impurities are implanted at a high density, contact layers 6a' and 6b', into which impurities are implanted at a low density, and a semiconductor layer 4a of a-Si itself are formed on the semiconductor layer 4 located on the gate insulating layer 3. These five layers are implanted with ions and formed in accordance with the implantation.

Figure 13:
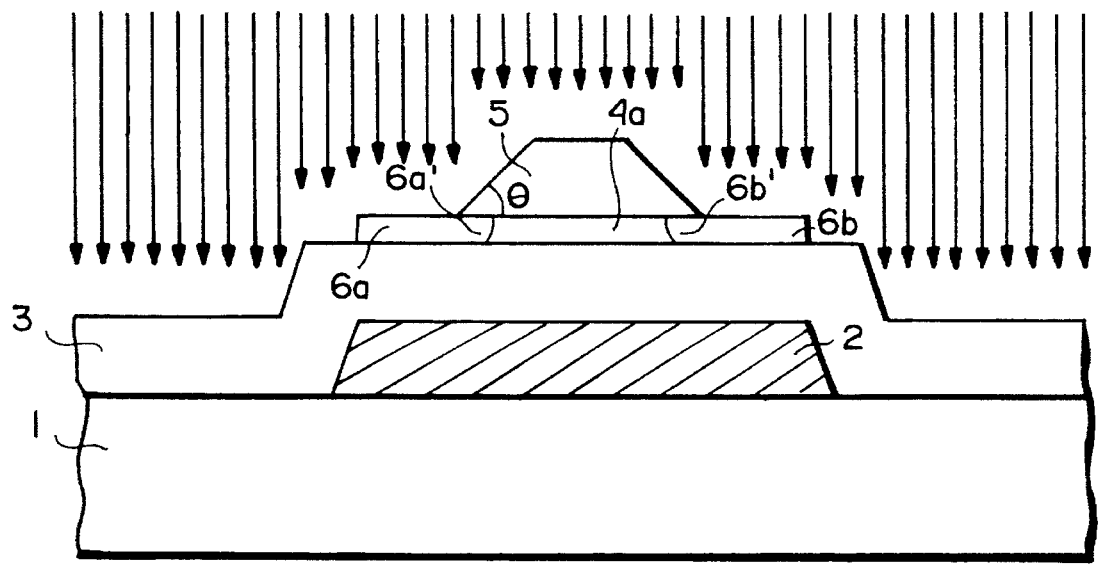
FIG. 13 is a sectional view showing a method for producing the active matrix shown in FIG. 11.

In concrete, as shown in FIG. 13, the semiconductor layer 4a is laminated on the gate insulating layer 3 with a thickness of 20 nm to 50 nm by plasma CVD method, then patterned. Then, the channel protective layer 5 made of SiNx is similarly laminated on the semiconductor layer with a thickness of 100 nm to 300 nm. In this step, the side surface of a resist can be formed obliquely by making the backing temperature of the resist lower. The side surface of the channel protective layer 5 is formed obliquely with the angle θ by withdrawing the side surface of the resist by dry etching to etch the channel protective layer 5. At this time, the etching selection ratio of the channel protective layer and the semiconductor layer must be arranged to be large. As for wet etching, taper is readily obtained by etching with BHF (etching buffer solution which is a mixture of hydrogen fluoride and ammonium fluoride) after the resist pattern is formed in the process of photolithograph.

As shown in FIG. 13, the cross section of the channel protective layer 5 has the shape of a trapezoid of which the upper side is arranged to be smaller than the bottom side. The oblique angle θ is smaller than 90°, preferably 10° to 50°. Making the side of the channel protective layer 5 oblique enables the lower layer of the channel protective layer to be thin, whereby ions are readily implanted. The shape of the protective layer 5 is not limited to the trapezoid. A Mountain-like shape is acceptable.

Then, impurities of Group V elements such as $P^+$, $PH^+$, $PH^{2+}$, $B^+$, $As^-$ or the like and the compounds thereof, or Group III elements or the compounds thereof are implanted into the semiconductor layer 4 at the accelerating voltage of 1keV to 100 KeV, preferably 5 keV to 50 keV. In this example, $P^+$ is implanted. At this time the portion of the semiconductor layer 4 which is not covered with the channel protective layer 5 becomes the contact layers 6a and 6b into which impurities are implanted at a high density. While the portion which is covered becomes contact layers 6a' and 6b' into which are implanted impurities at a low density, because the thickness of the low portion of the inclined side surface is small, and the semiconductor layer 4a is formed on the central portion disposed directly under the channel protective layer 5 keeping the original state.

A source electrode 7 and a drain electrode 8 are formed on the substrate 1 having one side on the channel protective layer 5. These source electrode 7 and drain electrode 8 have a thickness of 200 nm to 400 nm respectively and are made of Ti, Al, Mo, Cr or the like.

The thin film transistor is produced as described above. The active matrix substrate is formed by making pixel electrode 10 electrically connected to the drain electrode 8. The pixel electrode 10 is formed from an indium tin oxide layer (ITO) with a thickness of 50 nm to 100 nm.

As shown in FIG. 12, the channel protective layer 5 has contact layers 6a' and 6b' thereunder into which impurities are implanted at a low density. Therefore, the distance between the semiconductor layer 4 and the source electrode 7, and the semiconductor layer 4 and the drain electrode 8 are separated by the presence of the contact layers 6a' and 6b', into which impurities are implanted at a low density, thereby decreasing 1 to 2 digits of leak electric current which generated between the source electrode 7 and the drain electrode 8 to control leak occurrence. Moreover, by using the method of the present invention, the active matrix substrate having a structure described above can be formed without increasing the number of processes and photomasks. As a result, the method of the present invention can be applied for the display device of an active matrix type which requires large electric current.

EXAMPLE 5

This example is directed to a method for forming contact layers on a semiconductor layer disposed directly under a channel protective layer by the different way from that described in Example 4.

Figure 14:
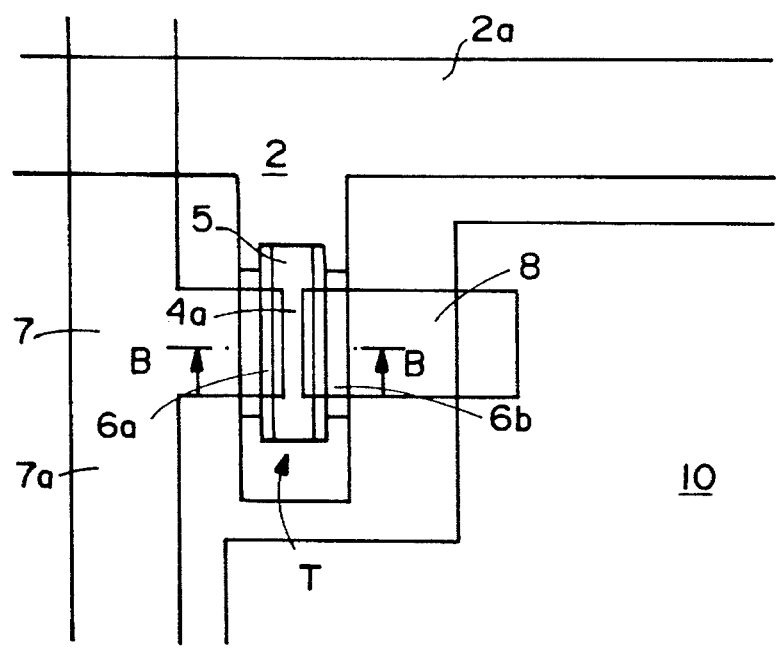
FIG. 14 is a plan view showing an active matrix substrate produced by another method of the present invention.
Figure 15:
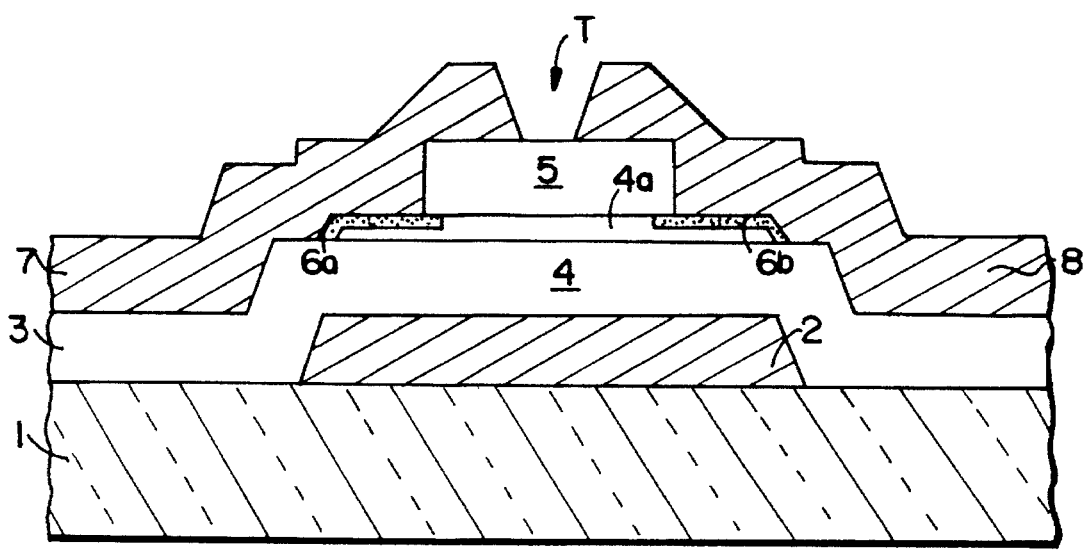
FIG. 15 is a sectional view taken along line B—B shown in FIG. 14.

An active matrix substrate produced in such a method is shown in FIGS. 14 and 15. A gate bus line 2a and a source bus line 7a are disposed in the form of a grid on an insulating substrate 1 made of a transparent glass as shown in FIG. 14. A pixel electrode 10 is disposed in the area surrounded by both lines 2a and 7a in the form of matrix. The pixel electrode 10 is necessary when used as an active matrix, but not as a thin transistor. The gate electrode 2 is formed in the form of projection from the gate bus line to the pixel electrode 10 and a thin transistor T is formed on the gate electrode 2.

FIG. 15 shows the sectional structure of the thin film transistor T. The gate electrode 2 is formed by laminating metals of a single layer or plural layers made of Ta, Ti, Al, Cr or the like on the insulating substrate 1 by a sputtering method, then patterning the metal layer. The gate bus line 2a is formed at the same time.

The gate insulating layer 3 is formed on the insulating substrate 1 to cover the gate electrode 2. Then, semiconductor layer 4 made of amorphous silicon is formed. The gate insulating layer 3 is formed by laminating SiNx to have a thickness of 200 nm to 500 nm by the plasma CVD method. The semiconductor layer 4 thereon contains contact layers 6a and 6b on both sides of the semiconductor layer 4 of the central portion in the width direction. These semiconductor layer 4a and contact layers 6a an 6b are formed by implantation of ions into the semiconductor layer 4, more particularly, formed in accordance with the ion implantation.

Figure 16:
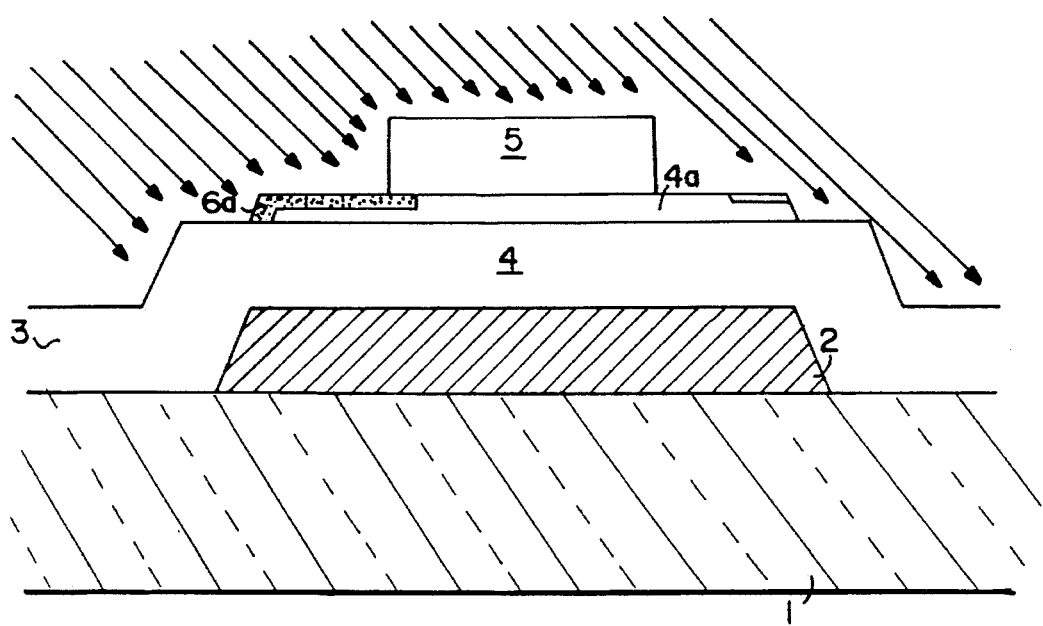
FIG. 16 is a sectional view showing a method for producing the active matrix substrate shown in FIG. 14.
Figure 17:
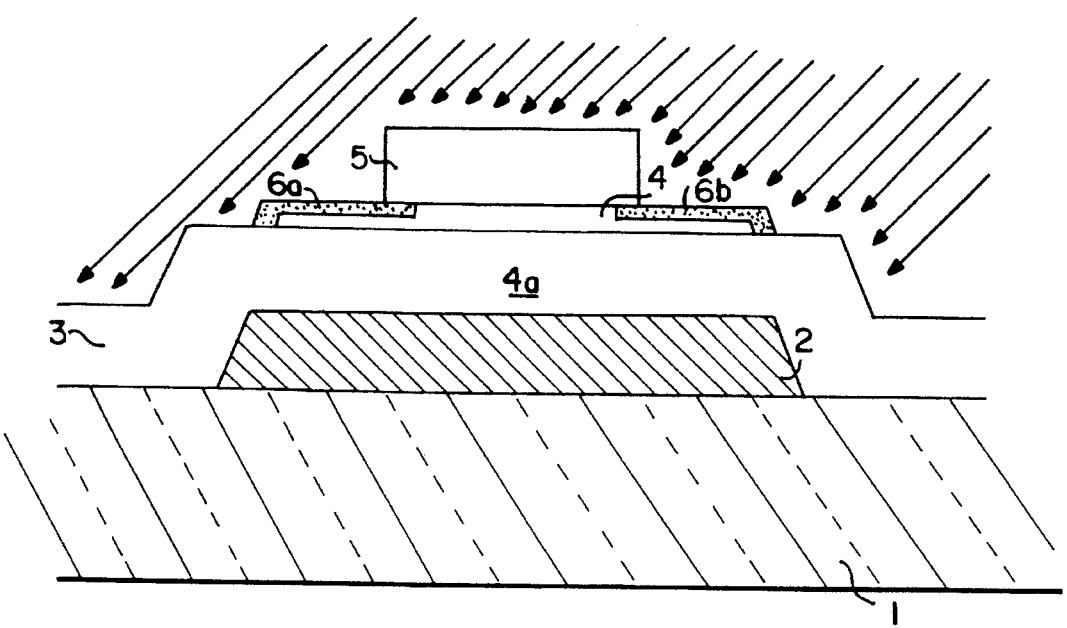
FIG. 17 is a flow chart for producing the active matrix substrate shown in FIG. 14.

The ion implantation is performed in the process shown in FIGS. 16 and 17. As shown in FIG. 16, amorphous silicon is laminated on the gate insulating layer 3, for example, by plasma CVD method to the thickness of 20 nm to 50 nm, then patterned to form semiconductor layer 4. Next, a channel protective layer 5 made of SiNx or the like is similarly formed with a thickness of 100 nm to 300 nm. The channel protective layer 5 is formed in the center of the semiconductor layer 4 to have a width smaller than that of the semiconductor layer 4.

Next, from the direction of the upper left side of the channel protective layer 5, as shown in FIG. 16, for example, impurities of Group V elements such as phosphorus or compounds thereof, or Group III elements such as boron or compounds thereof are ion implanted at the accelerating voltage of 1 kV to 100 kV, preferably 10 kV to 50 kV. The implantation "from the direction of upper left side" means an implantation from the side of a source electrode 7, which is formed later.

Next, as shown in FIG. 17, from the direction of the upper right side, ions are implanted as describe above. The contact layers 6a and 6b, into which ions are implanted at a low density, are formed by ion implantation more than two times from both sides in the width direction of the semiconductor layer 4, which is not covered with the channel protective layer, up to the portion from the end face of the channel protective layer. The semiconductor layer 4 keeping the original state is formed on the rest of the portion, namely, the central portion directly under the channel protective layer 5. The ion implantation into the insulating substrate 1 is performed with the angle of 10° to 80°, preferably 30° to 60°, more preferably 45°.

After the formation of the semiconductor layer 4 and the contact layers 6a and 6b, a source electrode 7 and a drain electrode 8 are formed having one end on the channel protective layer 5. The source electrode and the drain electrode 8 are formed by laminating metals such as Ti, Al, Mo, Cr or the like with the thickness of 200 nm to 400 nm, and patterning. The source bus line 7a is formed at the same time, thereby obtaining transistor T.

A pixel electrode 10 is formed by electrical connection to the drain electrode 8 on the insulating substrate 1. The pixel electrode is made of an indium tin oxide layer (ITO) having a thickness of 50 nm to 100 nm.

According to the active matrix produced as described above, the contact layers 6a and 6b, into which impurities are implanted under the channel protective layer 5, are formed as shown in FIG. 15. Therefore, the distance between the semiconductor layer 4 and the source electrode 7, and the semiconductor layer 4 and the drain electrode 8 are separated by the presence of the contact layers 6a' and 6b', into which impurities are implanted at a low density, thereby improving the insulation therebetween, so that in the use of the active matrix of this type leak electric current generated between the source electrode 7 and drain electrode 8 can be made from 1 to 2 digits smaller to control leak occurrence.

Moreover, by using the method of the present invention, the active matrix substrate having a structure described above can be formed without increasing the number of processes and photomasks, thereby improving the yield rate and reliability. As a result, the method of the present invention can be used as a display device of an active matrix type which requires large electric current.

Although Taper is not formed in the channel protective layer described above, it is apparent that a tapered channel protective layer can be used for the present invention.

EXAMPLE 6

This example discloses a method forming contact layer even in the portion of a semiconductor layer directly under the end of a channel protective layer by the additional method.

Figure 18:
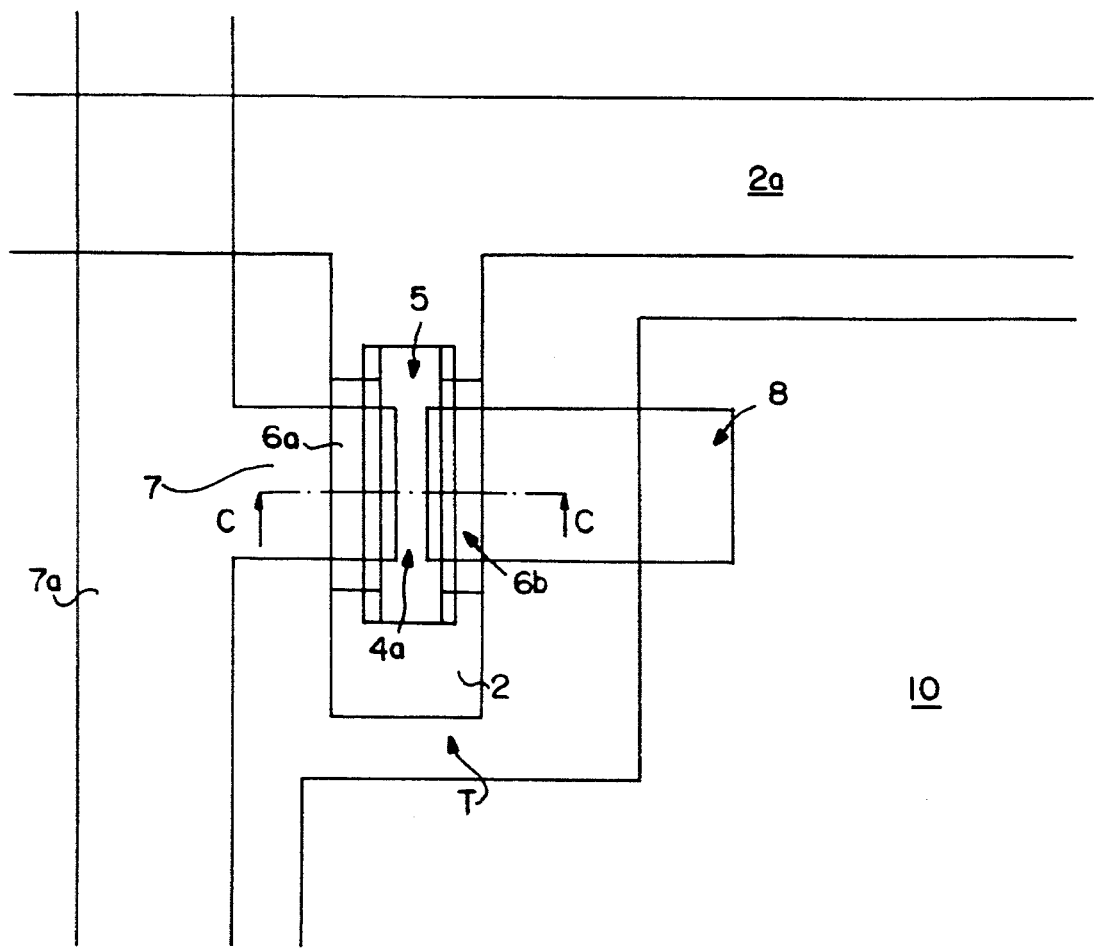
FIG. 18 is a plan view showing an active matrix substrate produced by another method of the present invention.
Figure 19:
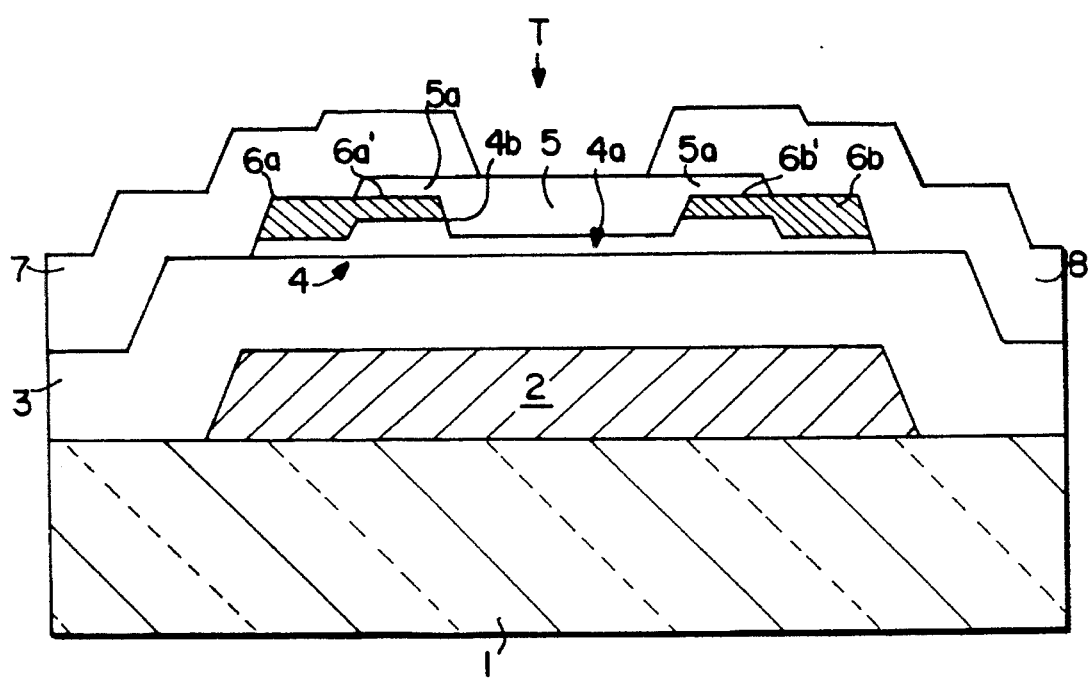
FIG. 19 is a sectional view taken along line C—C shown in FIG. 18.

FIGS. 18 and 19 (sectional view taken along line C—C) show such an active matrix. A gate bus line 2a and a source bus line 7a are disposed in a grid form on the insulating substrate 1 made of transparent glass as shown in FIG. 18. A pixel electrode 10 is disposed in the matrix form in the area surrounded by both of the bus lines 2a and 7a. Thin film transistor T is formed on the gate electrode 2 which is formed in the form of projection in the direction from the gate bus line to the pixel electrode 10.

FIG. 19 shows the sectional structure of the thin film transistor T of the active matrix. The gate electrode 2, the gate insulating layer 3, the semiconductor layer 4, the channel protective layer 5, the source electrode 7 and the drain electrode 8 are laminated on the insulating substrate 1 from the insulating substrate side in this sequence. The process of producing the active matrix substrate will be described as follows.

Figure 20:
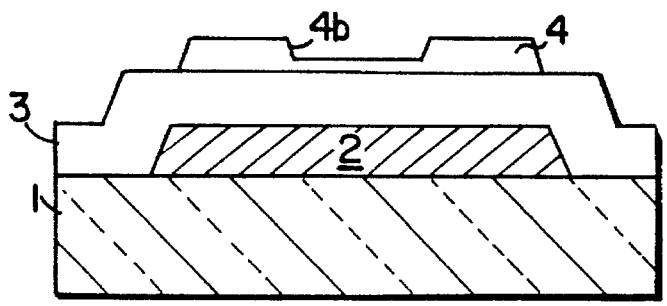
FIGS. 20A to 20D are a series of sectional views showing the production method for the active matrix substrate shown in FIG. 18.
Figure 20:
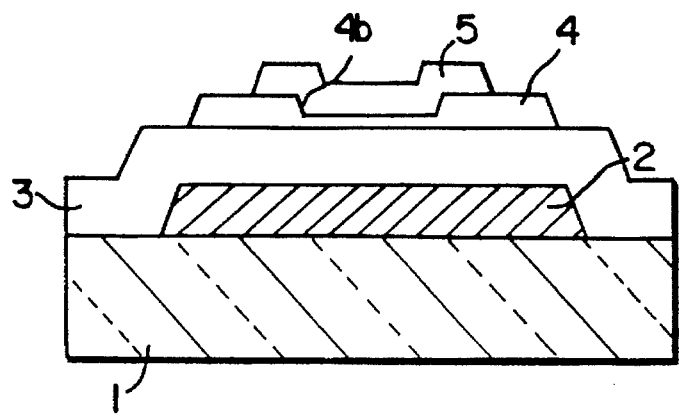
Figure 20:
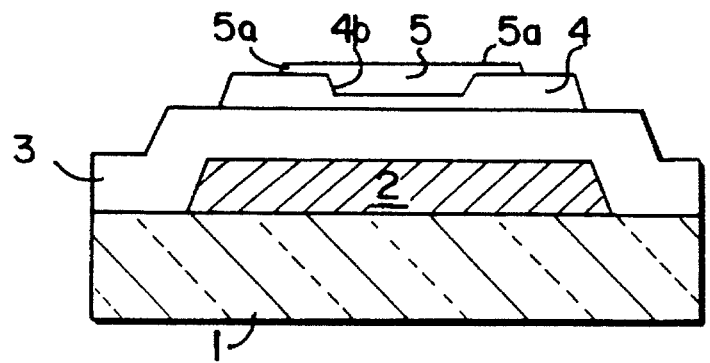
Figure 20:
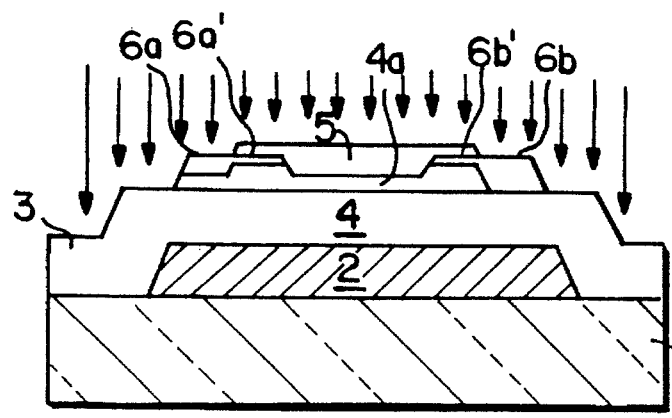

As shown in FIG. 20A, metals such as Ta, Ti, Al, Cr or the like are laminated on the transparent insulting substrate 1 by sputtering method with a thickness of 200 nm to 400 nm, then patterned to form the gate electrode 2. The gate bus line 2a is formed at the same time.

Next, the gate insulating layer 3 is formed so as to cover the gate electrode 2 on the insulating substrate 1, then the semiconductor layer 4 made of amorphous silicon is formed thereon. The gate insulating layer 3 is formed by laminating SiNx to have a thickness of 200 nm to 400 nm, for example, by plasma CVD method. The semiconductor layer 4 thereon is formed as follows. First, the amorphous silicon layer is laminated with a thickness of 150 nm to 350 nm, for example, by plasma CVD method.

As shown in FIG. 20B, the central portion of the semiconductor layer 4 is etched leaving the thickness of 50 nm to 100 nm. The channel protective layer 5 made of SiNx is formed in the same way in the central portion to have a thickness of 100 nm to 300 nm. The width of the channel protective layer 5 is arranged to be smaller than that of the semiconductor layer 4. The step portion generated by the concave present on the semiconductor layer 4 is leveled by etching as shown in FIG. 20C. As a result, thin film layers 5a are formed on both sides of the channel protective layer 5.

Then, as shown in FIG. 20D, from the surface of the channel protective layer 5, for example, impurities of Group V elements such as phosphorus or the compound thereof, or Group III elements such as boron or the compounds thereof are ion implanted at the accelerating voltage of 1 kV to 100 kV, preferably 10 kV to 50 kV. The contact layers 6a and 6b into which impurities are implanted at a low density are formed by the implantation on both sides in the width direction of the semiconductor layer 4 which is not covered with the channel protective layer 5. In contrast, impurities are not implanted into the central portion in the width direction of the semiconductor layer 4, thereby maintaining the semiconductor layer 4a in its original state.

As described above, after the formation of the semiconductor layer 4a and the contact layers 6a, 6b, 6a' and 6b', the source electrode 7 and the drain electrode 8 are formed having one end on the channel protective layer 5. In order to form the source electrode 7 and the drain electrode 8, metals such as Ti, Al, Mo, Cr or the like are laminated to have a thickness of 200 nm to 400 nm, then patterned. The source bus line 7a is formed at the same time. The thin transistor T is formed as described above.

Then, a pixel electrode 10 is formed by the electric connection to the drain electrode 8 on the insulating substrate 1 to form the active matrix substrate. The pixel electrode 10 is formed from an indium tin oxide layer (ITO) with a thickness of 50 nm to 100 nm.

According to the active matrix as described above, the contact layers 6a' and 6b' into which impurities are implanted are formed under the channel protective layer 5. Therefore, the distance between the semiconductor layer 4 and the source electrode 7, and the semiconductor layer 4 and the drain electrode 8 are separated by the presence of the contact layers 6a' and 6b' into which impurities are implanted at a low density, thereby improving the insulation therebetween. As a result, leakage (electric current leak) generated between the source electrode 7 and the drain electrode 8 can be controlled by the use of a shutter matrix produced in the process as described above.

EXAMPLE 7

This example is also directed to a method forming contact layers even on the portion of a semiconductor layer directly under the end of a channel protective layer in an additional way.

Figure 21:
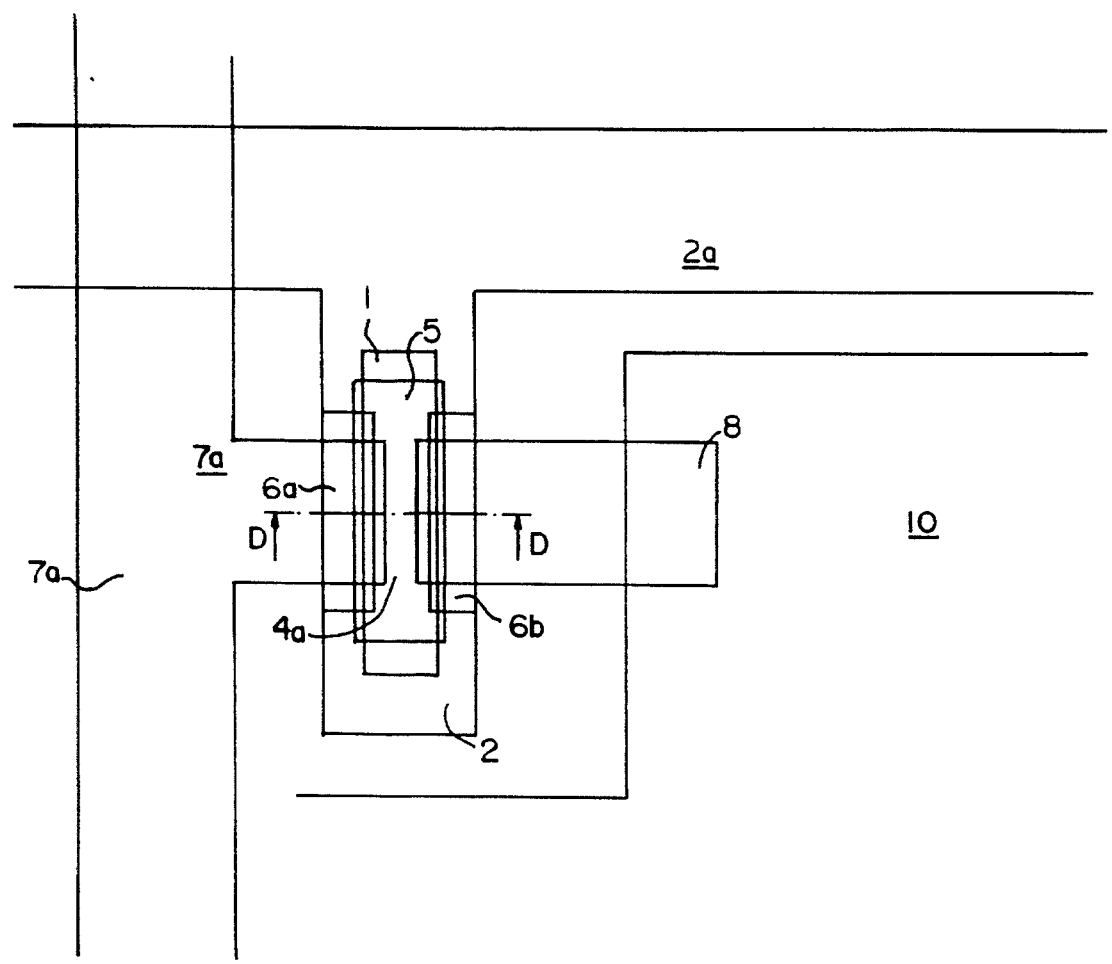
FIG. 21 is a plan view showing an active matrix substrate produced by another method of the present invention.
Figure 22:
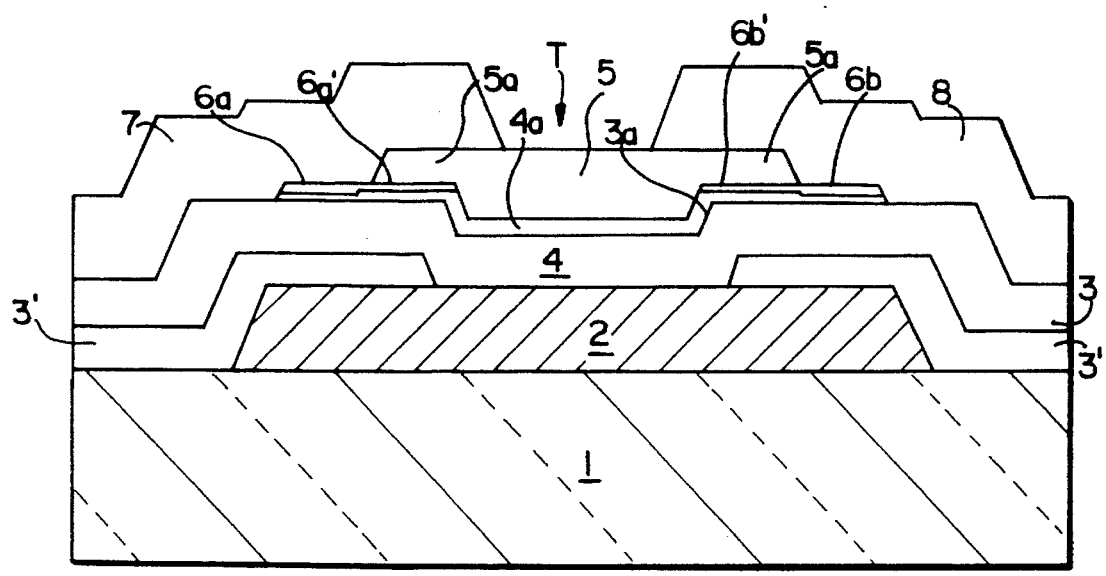
FIG. 22 is a sectional view taken along line D—D shown in FIG. 21.
Figure 23:
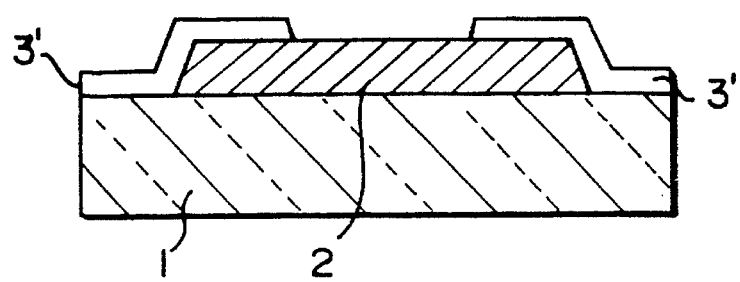
FIGS. 23A to 23D are a series of the active matrix shown in FIG. 21.
Figure 23:
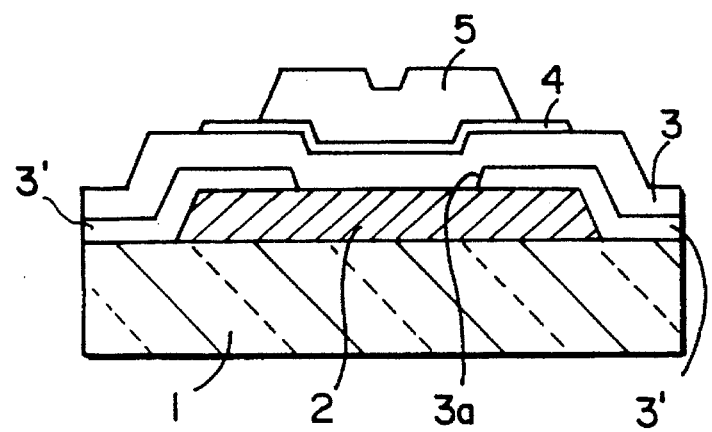
Figure 23:
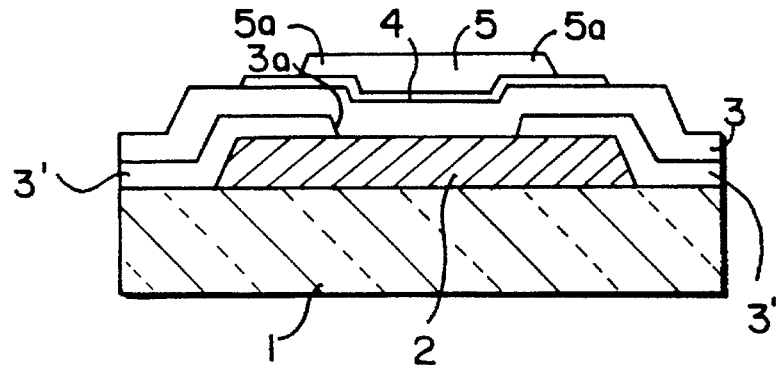
Figure 23:
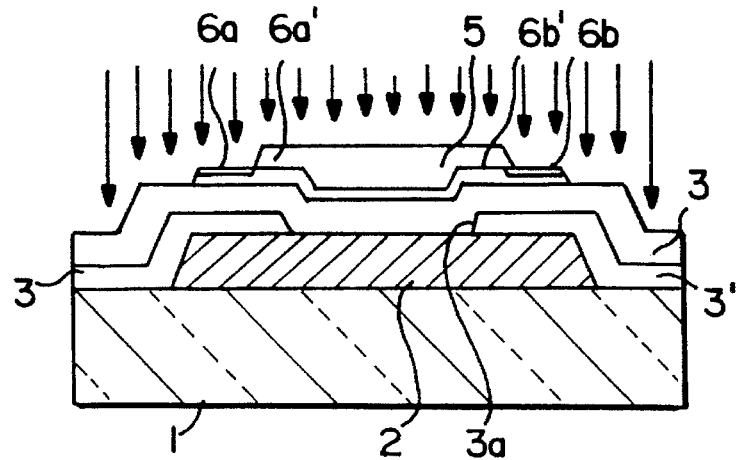

FIGS. 21 to 23 show such an active matrix. FIG. 22 is a sectional view taken along the line D—D in FIG. 21. In this example, a concave area 3a is formed in the central portion of a gate insulating layer 3 and the semiconductor layer 4 thereon is formed in the form of a step along with the channel protective layer 5. The contact layers 6a' and 6b' are formed in the portion disposed under both ends in the width direction of the channel protective layer 5 of the semiconductor layer 4.

The thin film transistor of this example has almost the same construction and producing process as the example above, so that the difference is explained as follows.

After the formation of a gate electrode 2 on the insulating substrate 1 as described above, the gate insulating layer 3' is laminated on both sides of the gate electrode 2 as shown in FIG. 23A in order to make a portion different in level from the gate insulating layer 3, thereby forming a concave portion 3a in the center of the width direction thereof. In concrete, for example, SiNx is laminated by plasma CVD method or SiO₂ is laminated by sputtering method to have a thickness of 80 nm to 100 nm, then patterned.

Then, as shown in FIG. 23B, the gate insulating layer 3 and the semiconductor layer 4 made of amorphous silicon are formed in this sequence on the gate electrode 3'. The concave portion 3a is formed in the center in the width direction of the gate insulating layer 3 and the semiconductor layer 4 is formed in a step shape as shown. The gate insulating layer 3 of this example is formed by laminating SiNx with a thickness of 200 nm to 500 nm, for example, by plasma CVD method. The semiconductor layer 4 of this example is formed by laminating amorphous silicon with a thickness of about 20 nm to 50 nm, for example, by plasma CVD method, and patterned.

Then, as shown in FIG. 23B, the channel protective layer 5 is laminated with a thickness of 200 nm to 300 nm on the semiconductor layer 4, then the surface of the channel protective layer 5 is leveled in the same way by etching (FIG. 23C).

Next, as shown in FIG. 23D, ions are implanted from the surface of the channel protective layer 5 in the same way. The contact layers 6a and 6b, into which impurities are implanted at a high density in the portion of the width direction of the semiconductor layer 4 which is not covered with the channel protective layer 5, the contact layers 6a' and 6b', into which impurities are implanted at a low density in the portion located under both sides of the width direction of the channel protective layer 5 of the semiconductor layer 4, and the semiconductor layer 4a, into which impurities are not implanted in the center of the semiconductor layer, are formed respectively.

Then, the source electrode 7 and the drain electrode 8 described in the previous example is formed, thereby producing a thin transistor T as shown in FIGS. 21 and 22. The active matrix substrate is formed by making a pixel electrode 10 in the same way.

When the active matrix of this example is used, the electric current leak generated between the source electrode 7 and drain electrode 8 can be made 1 to 2 digits smaller. Moreover, the active matrix substrate having a structure as described above can be formed without increasing the number of processes and photomasks, thereby improving the yield rate and reliability. As a result, the method can greatly contribute to producing a display device of an active matrix type which requires large electric current.

The active matrix substrate using a thin transistor of the reverse-stagger type has been described above. However, not only this type but the active matrix substrate using thin film transistor of a stagger type can be used as described as follows.

EXAMPLE 8

This example is directed to a method for forming contact layers under the end portions of a gate insulating layer, on which a semiconductor layer is disposed.

Figure 24:
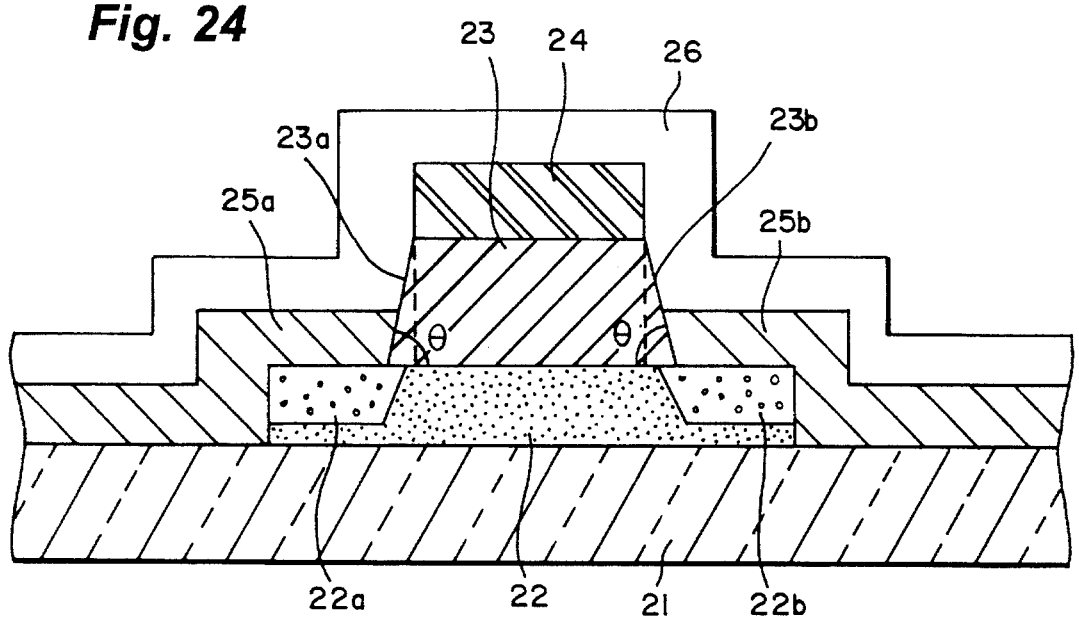
FIG. 24 is a sectional view taken along line E—E shown in FIG. 25.
Figure 25:
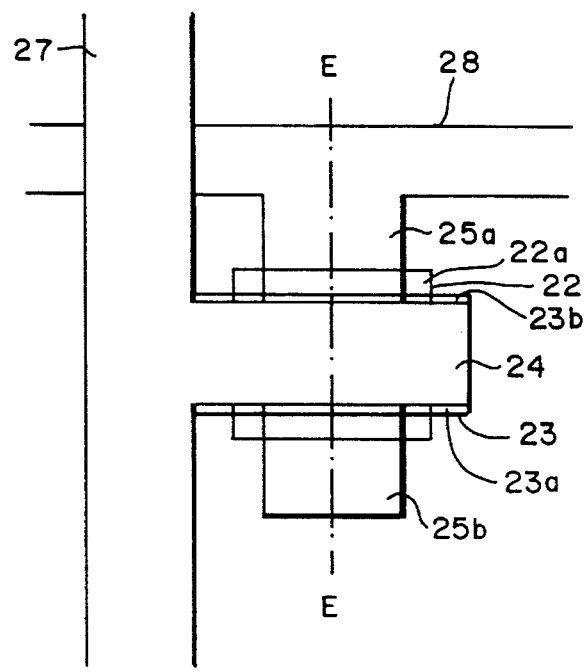
FIG. 25 is a plan view showing the active matrix substrate produced by another method of the present invention.

FIG. 25 is a plan view of such an active matrix substrate. FIG. 24 is a cross sectional view taken along line E—E in FIG. 25. The semiconductor layer 22, the gate insulating layer 23 and the gate electrode 24 are disposed in this sequence on a transparent insulating substrate 21 such as glass. The gate insulating layer 23 has a cross section of a long trapezoid of which the upper side is shorter than the bottom side, and the side surface thereof is inclined with the oblique angle θ. The gate electrode 24 thereon is formed such that the bottom side is equal to the upper side of the gate insulating layer 23. While the semiconductor layer 22 disposed under the gate insulating layer 23 has an upper width shorter than that of the bottom side thereof. Contact areas 22a and 22b are formed by ion implantation of impurities from both ends of the width direction of the semiconductor layer 22 to the under surface of both sides of the surface of the gate insulations 23a and 23b of the gate insulating layer 23. The gate electrode 24 is electrically connected to the gate electrode wiring 27 which sends signals for canning.

The source electrode 25a and the drain electrode 25b are formed separately in the gate insulating layer 23 from the semiconductor layer 22 to the substrate 21. The drain electrode 25b is electrically connected to a pixel electrode (not shown) formed by partially piling thereon. While the source electrode 25a is electrically connected to the source electrode wiring 28 for sending source signals. The protective layer 26 is formed over the whole surface of this substrate, thereby constructing the active matrix of this example.

Next, the method for producing the active matrix substrate with this construction is described as follows.

As described in FIG. 24, amorphous silicon is laminated on an insulation substrate 1 such as a glass to have a thickness of 20 nm to 150 nm, then patterned to form the semiconductor layer 22. Next, the gate insulating layer 23 made of SiNx or the like is laminated on the semiconductor layer 22 in the same way to have a thickness of 50 nm to 500 nm. In this case dry etching or wet etching is used to form the gate insulating layer 23 having the side surfaces 23a and 23b inclined. The oblique angle θ of the side surface is less than 90°, preferably 10° to 70°, more preferably 30° to 50°. The thickness of the lower part of the side surfaces 23a and 23b can be made thin by inclining the surface, such that impurities can be implanted into the semiconductor layer 22 disposed under both side surfaces 23a and 23b by ion implantation. The oblique angle θ of the side surfaces 23a and 23b may take different values.

Next, metals of a single layer or plural layers made of Ta, Ti, Al, Cr or the like is laminated on the gate insulating layer 23 by sputtering method to have a thickness of 200 nm to 400 nm, then patterned to form the gate electrode 24. When patterning, the gate electrode 24 is produced to have the same shape and the same size as the upper surface of the insulating layer 23 located thereunder.

Then, through the surface, impurities from Group V elements or compounds thereof, or Group III elements or the compounds thereof are ion implanted to the semiconductor layer 22 at the accelerating voltage of 1kV to 100 kV, preferably 10 kV to 50 kV. At this time, the contact areas 22a and 22b are formed on the portion of the semiconductor layer 22 which is not covered with the gate insulating layer 23, and of the semiconductor layer 22 which is covered with the side surface of the gate insulating layer 23. Impurities are implanted into both layers. Impurities are not implanted into the central portion of the semiconductor layer 22 covered with the gate insulating layer 23 in order to maintain the original state, thereby functioning as channel area. The thickness of the semiconductor layer 22, the gate insulating layer 23 and the gate electrode 24 can be determined in accordance with the ion implantation of the contact areas 22a and 22b.

Next, a resist layer is formed in the shape of reverse-taper by dichlorobenzene treatment etc., on the gate electrode 24. After that it is laminated with Ti, Cr, Mo, Al or the like to have a thickness of 200 nm to 400 nm and lifted off, thereby forming the source electrode 25a and the drain electrode 25b in the prescribed area on the semiconductor layer 22 and the substrate 21.

Next, a pixel electrode (not shown) is formed by partially piling with the drain electrode 25b to form a protective layer 26 throughout this substrate 21, thereby producing the active matrix substrate of the present invention.

Accordingly, there are contact areas 22a and 22b implanted impurities under the gate insulating layer 23 in the active matrix substrate produced above, as shown in FIG. 24. Therefore, the portion between the channel area and the source electrode 25a, and the channel electrode and the drain electrode 25b are separated by the presence of the contact area 22a and 22b, into which impurities are implanted at a low density, thereby lessening the leak electric current generated between the source electrode 25a, and making the drain electrode 25b 1 to 2 digits smaller. Therefore, leak occurrence can be controlled. As a result, the method of the present invention can be used as a display device of the active matrix type which requires large electric current. Moreover, by using the method of the present invention, the active matrix substrate can be formed without increasing the number of processes and photomasks, thereby producing an active matrix in which leak is controlled.

Not only amorphous silicon but also polysilicon can be used as the semiconductor layer 22.

In addition, $SiO_2$ can be used for the gate insulating layer 23 instead of SiNx of this example.

EXAMPLE 9

This example also applies to a stagger type. A contact layer is formed under the end portion of a gate insulating layer of a semiconductor layer disposed under the gate insulating layer by a method different from Example 8.

Figure 26:
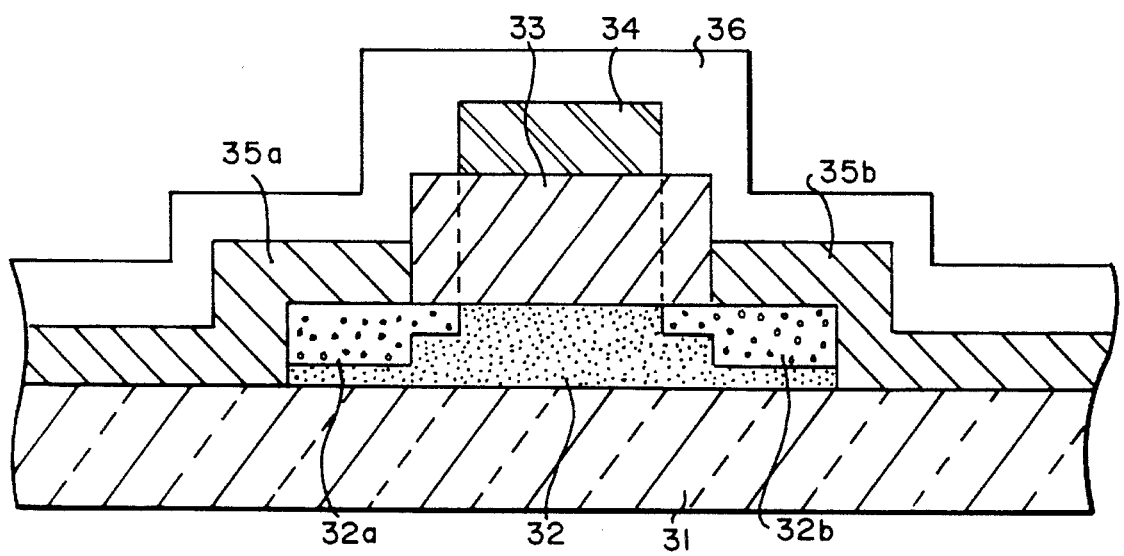
FIG. 26 is a sectional view taken along line F—F shown in FIG. 27.
Figure 27:
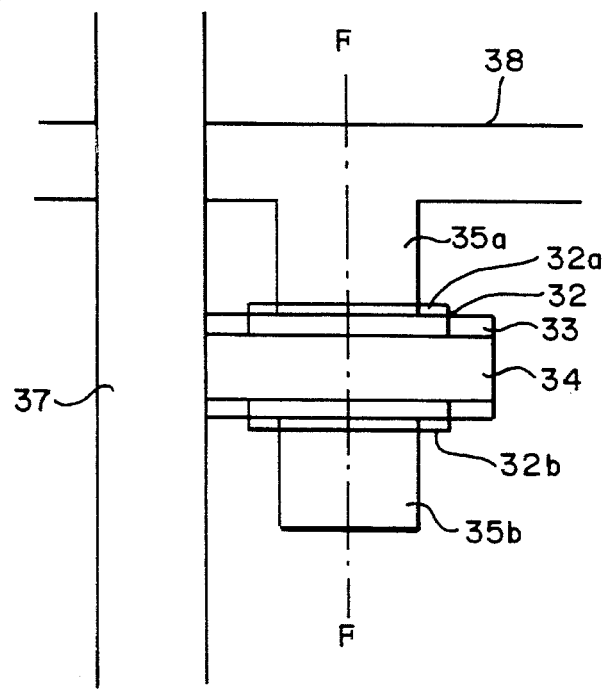
FIG. 27 is a plan view showing an active matrix substrate produced by another method of the present invention.

FIG. 27 shows a plan view of such an active matrix substrate. FIG. 26 is a cross sectional view taken along line F—F. The semiconductor layer 32, the gate insulating layer 33 and an gate electrode 34 are laminated in this sequence on a transparent insulating substrate to form the active matrix substrate. The width of each layer (line F—F direction) of the semiconductor layer 32 is greater than that of the gate insulating layer 33, and the width of each layer of the gate insulating layer 33 is greater than that of the gate electrode 34. Impurities are implanted into contact areas 32a and 32b by ion implantation. The contact areas 32a and 32b are formed on both sides of the semiconductor layer 32 in the width direction from the lower part of the end of gate electrode 34 to the end of the semiconductor layer 32. The gate electrode 34 is electrically connected to the gate electrode wiring 37 for sending scanning signals.

A source electrode 35a and a drain electrode 35b are formed by branching the gate insulating layer 33 on the prescribed area from the semiconductor layer 32 to the substrate 31. The drain electrode 35b electrically connects to a pixel electrode (not shown) thereon which is formed by partially piling. While the source electrode 35a electrically connects the source electrode wiring 38 for sending source signals. The protective layer 36 is formed on the whole surface of the substrate 31 to construct the active matrix of this example.

The method for producing the active matrix substrate is described as follows.

First, amorphous silicon is laminated on the transparent insulating substrate 31 such as a glass to have a thickness of 20 nm to 150 nm, then patterned to form the semiconductor layer 32.

Next, SiNx is laminated on the semiconductor layer 32 with a thickness of 50 nm to 500 nm to form the gate insulating layer 33.

Then, metals such as Ta, Ti, Al, Cr or the like of a single layer or plural layers are laminated by sputtering method with the thickness of 200 nm to 400 nm, and patterned to form the gate electrode 34. When patterning, the gate electrode 34 must be formed with smaller width than that of the gate insulating layer 33 thereunder. As a result, impurities can be implanted into the semiconductor layer 32 disposed under the gate insulating layer 33 where the gate electrode 34 is not formed.

Then, impurities of Group V elements or compounds thereof, or Group III elements or the compounds thereof are ion implanted into the semiconductor layer 32 at the accelerating voltage of 1 kV to 100 kV. At this time contact areas 32a and 32b are formed by implantation of impurities on part of the semiconductor layer 32 which is not covered with the gate insulating layer 33, and part of the semiconductor layer 32 under the gate insulating layer 33 which is not covered with the gate electrode 34. The central part of the semiconductor layer 32 disposed under the gate insulating layer 33 attains an original state to form the channel area. The thickness of the semiconductor layer 32, the gate insulating layer 33 and the gate electrode 34 can be determined in accordance with the ion implantation.

Next, a reverse-tapered resist is formed by dichlorobenzene treatments the gate electrode 34, and laminated with Ti, Ct, Mo, Al etc., to have a thickness of 200 nm to 400 nm, then lifted off. As a result, the source electrode 35a and the drain electrode 35b branched by the gate insulating layer 33 are formed on the prescribed area from the semiconductor layer 32 to the substrate 31.

Then, a pixel electrode which is electrically connected to the drain electrode 35b is formed by partially piling on the drain electrode 35a. The protective layer 36 covers the whole surface of this substrate 31, thereby forming the active matrix substrate.

Accordingly, as shown in FIG. 26, there are contact areas 32a and 32b, into which impurities of the gate insulating layer 33 are implanted to the active matrix substrate produced as described above. The area between the channel area and the source electrode 35a, and between the channel area and the drain electrode 35b are separated by the presence of the source electrode 35a and the drain electrode 35b, whereby the leak of electric current generated between the source electrode 35a and the drain electrode 35b can be made 1 to 2 digits smaller. Therefore, the leak occurrence can be controlled, so that the method can be used for a display device of active matrix type which requires great electric current. Moreover, the thin film transistor controlling the leak occurrence can be produced without increasing the number of the processes and photomasks.

Not only amorphous silicon but also polysilicon having a thickness of 50 nm to 200 nm can be used for the semiconductor layer 32.

Further, $SiO_2$ can be used for the gate insulating layer 33 instead of SiNx.

If the insulating substrate is transparent, it is possible to pattern as follows.

Figure 28A:
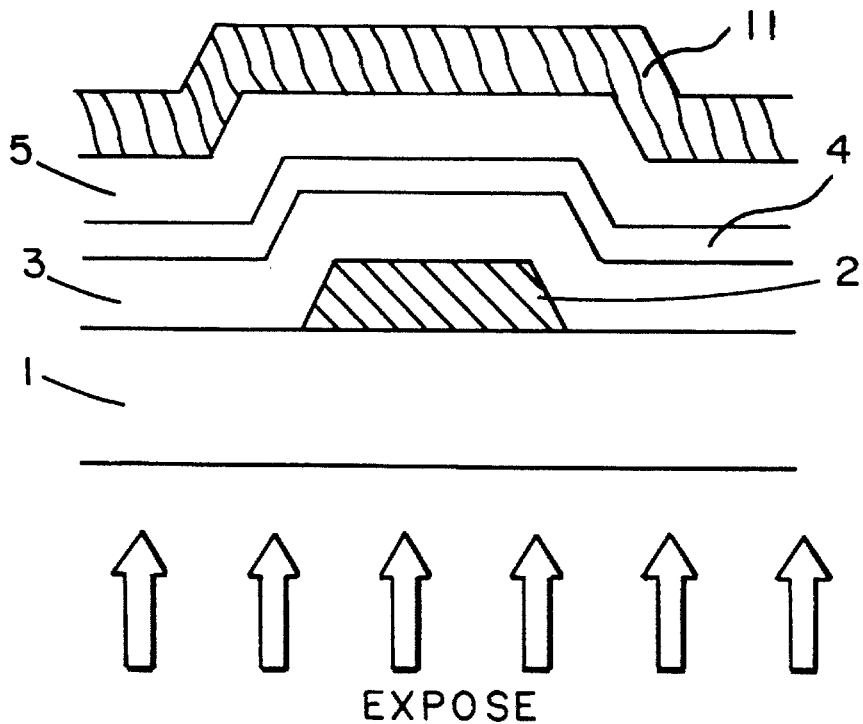
FIGS. 28A and 28B are sectional views showing a method for producing the active matrix substrate by other method of the present invention.
Figure 28B:
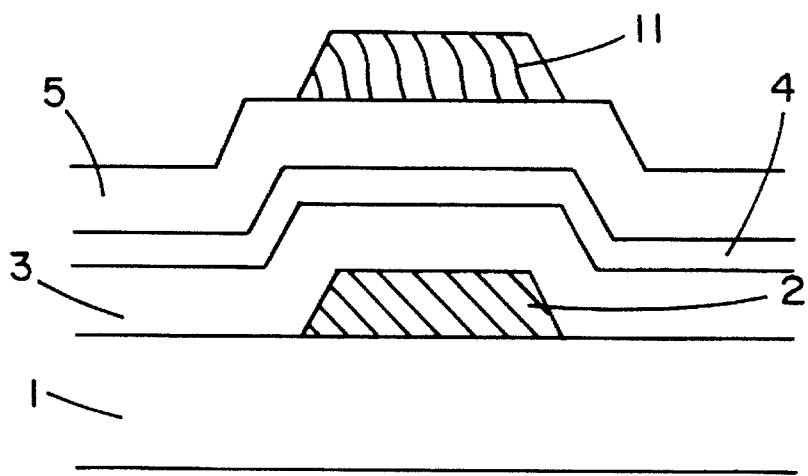
Figure 29A:
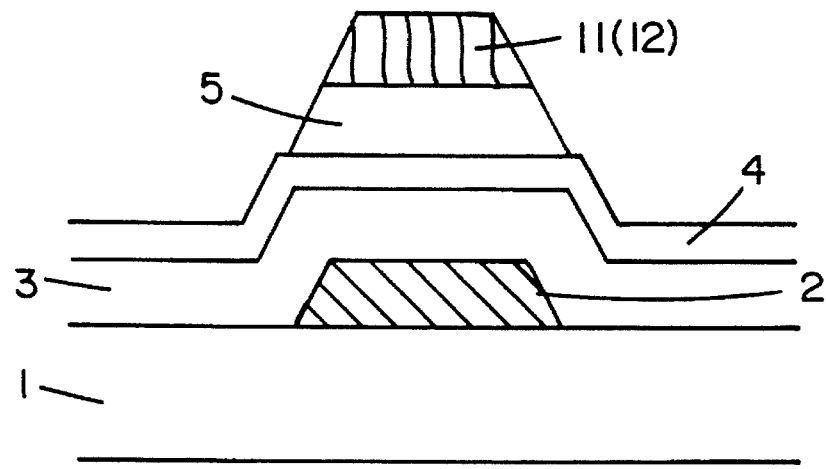
FIGS. 29A and 29B are sectional views showing a continuation from FIG. 28.
Figure 29B:
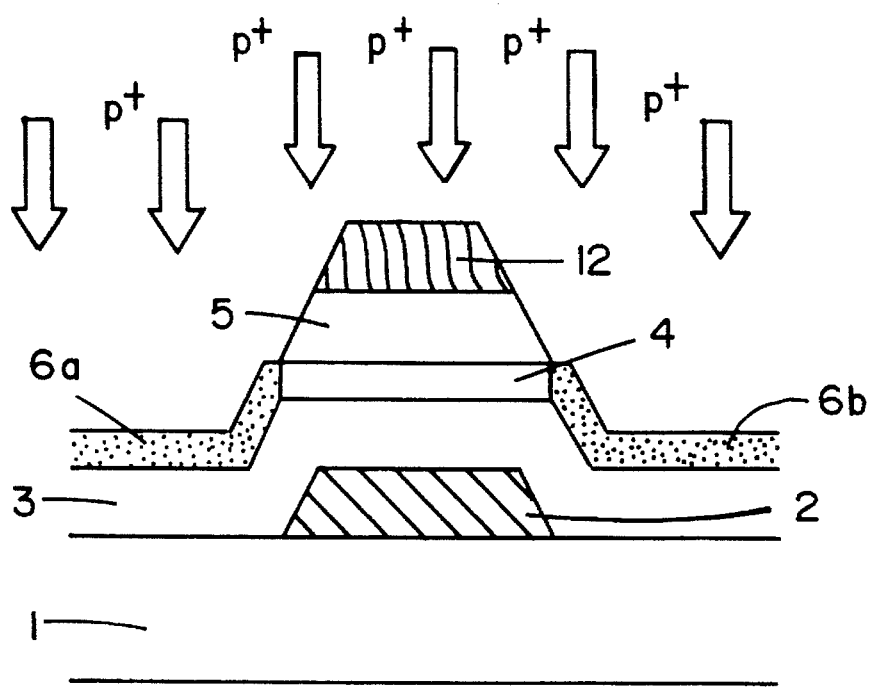

FIGS. 28, 29 and 30 are sectional views showing the method for producing an active matrix substrate. FIG. 31 shows how the active matrix substrate is to be produced. FIG. 31B is a section view taken along line I—I in FIG. 31A.

As shown in FIG. 28A, Ta is laminated on the glass substrate 1 by sputtering method to have a thickness of 200 nm to 400 nm, for example 300 nm. Then the gate electrode 2 is formed by the use of a photomask. Next, the gate insulating layer 3 made of SiNx by plasma CVD method having a thickness of 200 nm to 500 nm, for example 300 nm, the semiconductor layer 4 made of a-Si with a thickness of 30 nm and the channel protective layer 5 with a thickness of 100 nm to 300 nm, for example 200 nm are laminated in this sequence on the whole substrate 1 covering the gate electrode 2.

Then, after a resist 11 is coated on the channel protective layer 5, the gate electrode 2 is exposed from the opposite side of the lamination of each layer. Namely, the exposing is performed from the back of the glass substrate 1. Since the glass substrate 1, the gate insulating layer 3, the semiconductor layer 4 and the channel protective layer 5 are exposed by substrate-transmitted light, the amount of exposure must be increased compared to the case of exposing from the upper side of the resist to obtain an appropriate light.

Posi-resist (irradiated resist dissolved by development) is used for this example as usual. The thickness of the gate electrode 2 is set to the value required for cutting the light caused by exposing from the back. In this example, the thickness is 300 nm.

The exposed portion by the exposing from the back is dissolved by developing the resist 11, as shown in FIG. 28B, thereby obtaining the prescribed shape.

Then, the patterned channel protective layer 5, as shown in FIG. 29A, is formed by etching in the use of the resist 11. The resist 11 may be slightly reduced due to the etching so that the resist 11 has a reference number 12 as well in FIG. 29A to distinguish it. Hereinafter it is referred to as 12.

The contact layers 6a and 6b are formed by implantation of $P^+$ ions without peeling the resist 12 (implantation mask) from the upper side of the patterned channel protective layer 5 by the area implanted $P^+$ ion in the semiconductor layer 4. When implanting ion, the resist 12 remains, because the $P^+$ ion implantation is decreased compared to the case without the resist 12, thereby lessening electrical leak generated between the source electrode 7 and the drain electrode 8, which are described later. This causes weak current between the source electrode 7 and the drain electrode 8 when $P^+$ ions are implanted into the channel protective layer 5. However, if the resist 12 remains as described, the $P^+$ ion implantation into the channel protective layer 5 can be decreased compared to the case without the resist 12.

Figure 30A:
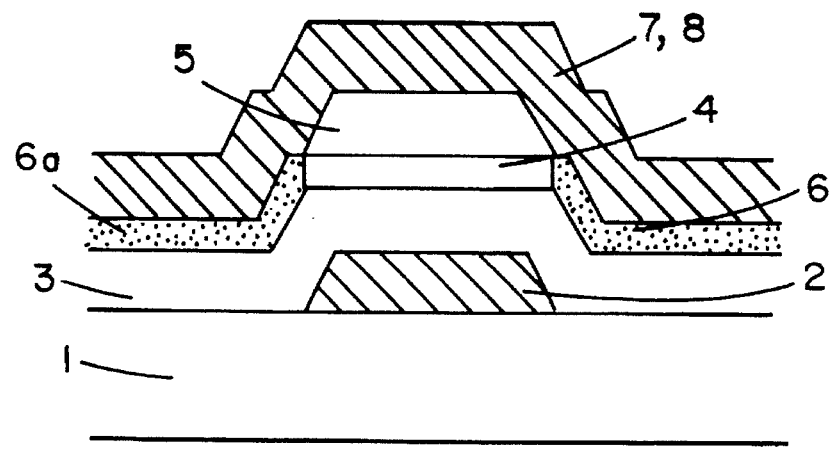
Figure 31A:
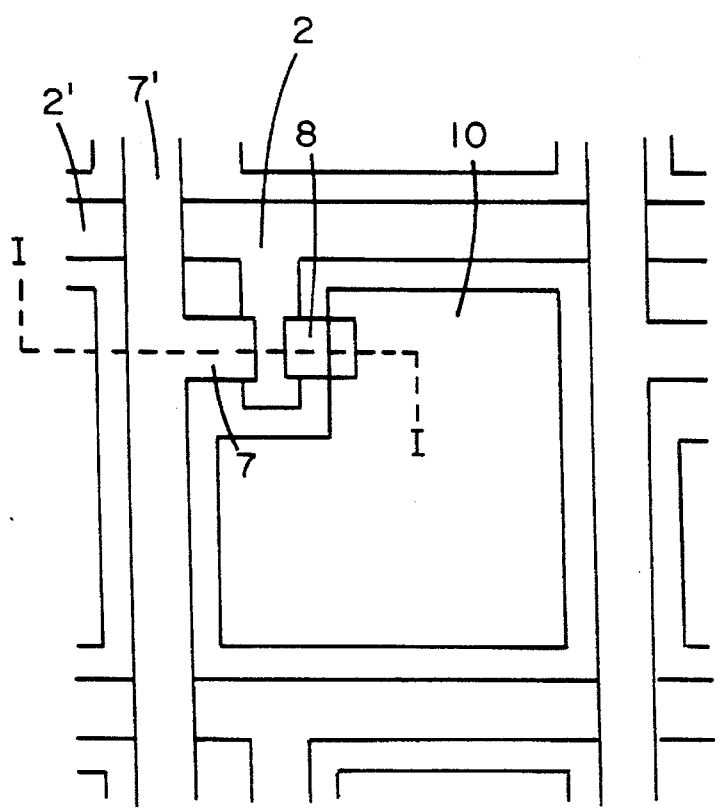
FIG. 31A is a plan view showing the active matrix substrate produced in the process of FIGS. 28 to 30.
Figure 31B:
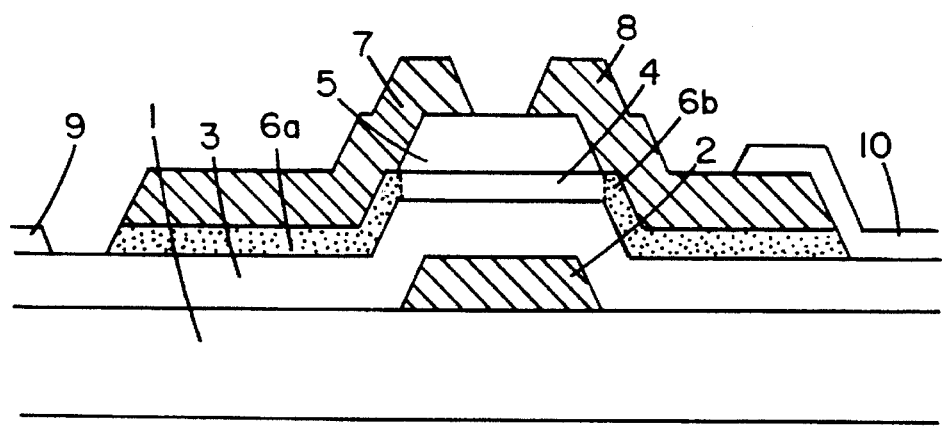
FIG. 31B is a sectional view taken along line I—I in FIG.

Then, after the resist 12 is peeled, a metal layer made of Ti or Mo is formed on the whole surface of the glass substrate i with a thickness of 200 nm to 400 nm for example Mo layer electrodes 7 and 8 with a thickness of 200 nm, by sputtering method as shown in FIG. 30A.

Figure 30B:
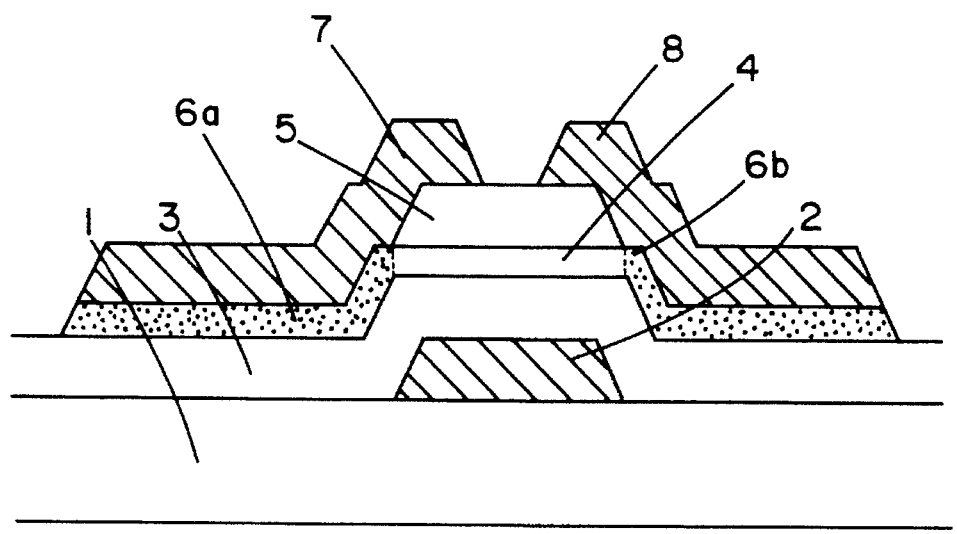

Further, the source electrode 7, the drain electrode 8 and the contact layers 6a and 6b are formed by patterning the metal layer and the contact layer by the use of a photomask, as shown in FIG. 30B. The source bus line 7' is patterned at the same time. The patterning is performed by a photolithographic method and the required exposure process is completed with a single exposure. Namely, exposing the coated resist by the use of photomask, then developing and patterning not only the metal layer but also the contact layer at the same time, thereby obtaining the source electrode 7 and the drain electrode 8, and the contact layers 6a and 6b. As a result, only one photomask (exposure mask) is used. Moreover, arranging the position of the exposure mask (alignment) is not necessary for disposing the source electrode and the drain electrode on the contact layer, which was necessary if the source electrode and the drain electrode, and the contact layer are patterned. As for etching, the source electrode and the drain electrode, and the contact layer can be etched at the same time, for example by wet etching (mixed solution of hydrogen fluoride and nitric acid), dry etching (carbon tetrachloride group). In this example, dry etching is used, since it shows desirable accuracy. The thickness of the resist is great enough if it is over 1 μm.

As described above, a thin film transistor having the sectional construction shown in FIG. 30A is formed. The transistor has little leakage of electric current between the source electrode 7 and the drain electrode 8, because of the small ion implantation to the channel protective layer 5. Further, the transistor is difficult to be snapped, because of the presence of the contact layer 6a even under the source bus line connected to the source electrode 7.

In addition, the transparent layer made of indium Tin oxide layer (ITO) is laminated on the whole surface of the glass substrate i on which the thin transistor is formed having a thickness of 50 nm to 100 nm, for example 80 nm, then patterned by the use of a photomask, as shown in FIG. 31A, thereby forming pixel electrode 10 to obtain the active matrix substrate. FIG. 31A shows a plan view of the active a matrix substrate and FIG. 31B shows the sectional view taken along line I—I of the active matrix substrate. As shown in FIG. 31A, the thin film transistor and the pixel electrode 10 are disposed in the form of matrix in accordance with the gate bus line 2' connected to the gate electrode 2 and the source electrode 7 connected to the source bus line 7'.

In this example, a-Si layer is used for the semiconductor layer, but polycrystal such as silicon can be also used. It is understood that the conventional material and construction of the active matrix can be applied.

According to the method, the number of photomasks and the exposure processes can be lessened, because the channel protective layer and the contact layer do not require a photomask, thereby improving the practicality. Moreover, when patterning the alignment gap can be prevented, so that an active matrix having excellent characteristics can be readily obtained.

In this example, the contact layer is formed on the semiconductor layer by ion implantation, however, the contact layer can be also formed to the same portion using another method, that is, by doping ion.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method for producing an active matrix substrate which uses a thin transistor layer having a semiconductor layer having a contact region and a channel region, a gate insulating layer, a gate electrode formed on a substrate in this sequence, a source electrode and a drain electrode each kept in contact with the contact region, the source electrode and the drain electrode partly overlapping with end portions of the semiconductor layer which end portions are wider than the gate insulating layer and the gate electrode, the gate insulating layer having declined sides wherein the sides thereof adjacent the gate electrode form a narrower top surface than a bottom surface thereof toward the substrate, and wherein ions are implanted into the semiconductor layer from the gate electrode such that a contact layer is formed in a portion of the semiconductor layer overlapping with at least part of the declining sides of the gate insulating layer and part of the semiconductor layer extending beyond the gate insulating layer.

2. A method according to claim 1, wherein the source electrode and the drain electrode overlap at least part of the declining sides of the gate insulating layer.

3. A method according to claim 2, wherein end portions of the gate electrode coincide with end portions of the narrower top surface of the gate insulting layer.

4. A method according to claim 3, wherein one of the declining sides of the gate insulating layer is declined at 10° to 70° with respect to the bottom surface of the gate insulating layer.

5. A method for producing an active matrix substrate comprising the steps of:

forming a semiconductor layer on a transparent insulating substrate;

forming a gate insulating layer on the semiconductor layer, the gate insulating layer having declining sides, wherein the sides thereof form a narrower top surface than a bottom surface thereof toward the transparent insulating substrate;

forming a gate electrode on the narrower top surface of the gate insulating layer;

forming a contact region in a portion of the semiconductor layer by an ion implanting method, the contact region overlapping at least part of the declining sides of the gate insulating layer and part of the semiconductor layer extending beyond the gate insulating layer, and wherein end portions of the gate electrode coincide with end portions of the narrower top surface of the gate insulating layer.

6. A method according to claim 5, wherein the method further includes the step of:

forming an electrode on the contact region, the electrode overlapping at least part of the declining sides of the gate insulating layer.

7. A method according to claim 5, wherein one of the declining sides of the gate insulating layer is declined at 10° to 70° with respect to the bottom surface of the gate insulating layer.

* * * * *

UNITED STATES PATENT AND TRADEMARK OFFICE
CERTIFICATE OF CORRECTION

PATENT NO. : 5,474,941
DATED : December 12, 1995
INVENTOR(S) : MITANI et al

It is certified that error appears in the above-indentified patent and that said Letters Patent is hereby corrected as shown below:

On title page,

Item [75] Inventors, the inventor Morimoto's name should be corrected to read  -- Hiroshi Morimoto --, not "Hirosshi Morimoto".

Signed and Sealed this

Twenty-sixth Day of March, 1996

Attest:

BRUCE LEHMAN

*Attesting Officer*  *Commissioner of Patents and Trademarks*